US 12,059,845 B2

(12) United States Patent
Taig et al.

(10) Patent No.: US 12,059,845 B2
(45) Date of Patent: *Aug. 13, 2024

(54) INTERACTIVE SLICING METHODS AND SYSTEMS FOR GENERATING TOOLPATHS FOR PRINTING THREE-DIMENSIONAL OBJECTS

(71) Applicant: Relativity Space, Inc., Long Beach, CA (US)

(72) Inventors: Elad Taig, Lexington, MA (US); Forrest Pieper, Watertown, MA (US); Mario Barrenechea, Cambridge, MA (US)

(73) Assignee: Relativity Space, Inc., Long Beach, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/363,527

(22) Filed: Aug. 1, 2023

(65) Prior Publication Data

US 2024/0033996 A1 Feb. 1, 2024

Related U.S. Application Data

(63) Continuation of application No. 16/862,075, filed on Apr. 29, 2020, now Pat. No. 11,718,036, which is a
(Continued)

(51) Int. Cl.
*G06T 17/00* (2006.01)
*B29C 64/386* (2017.01)
(Continued)

(52) U.S. Cl.
CPC ............ *B29C 64/386* (2017.08); *G06T 17/00* (2013.01); *G06T 17/10* (2013.01); *G06T 19/00* (2013.01);
(Continued)

(58) Field of Classification Search
None
See application file for complete search history.

(56) References Cited

U.S. PATENT DOCUMENTS 6,391,251 B1  5/2002  Keicher et al.
7,704,565 B2  4/2010  Slaughter
(Continued)

FOREIGN PATENT DOCUMENTS

WO  2015106840 A1  7/2015
WO  2016030884 A1  3/2016
(Continued)

OTHER PUBLICATIONS

International Preliminary Report on Patentability for International Application PCT/US2018/061093, Report issued May 19, 2020, Mailed on May 28, 2020, 11 pgs.
(Continued)

*Primary Examiner* — Yi Wang

(57) ABSTRACT

The present disclosure provides methods and systems for printing a three-dimensional part. The method comprises: receiving in computer memory a digital model of said three-dimensional object; using one or more computer processors to partition said digital model of said three-dimensional part into a plurality of partitions, wherein a given partition of said plurality of partitions comprises a plurality of slices, and wherein a given slice of said plurality of slices comprises a plurality of segments; receiving, from a user, one or more parameters that specify a printing configuration for at least one segment of said plurality of segments; and generating printing instructions based at least in part on said one or more parameters, which printing instructions are usable by a print head to print said three-dimensional object.

5 Claims, 29 Drawing Sheets

Related U.S. Application Data continuation of application No. PCT/US2018/061093, filed on Nov. 14, 2018.

(60) Provisional application No. 62/585,901, filed on Nov. 14, 2017.

(51) Int. Cl.
*G06T 17/10* (2006.01)
*G06T 19/00* (2011.01)
*B33Y 50/00* (2015.01)

(52) U.S. Cl.
CPC ......... *B33Y 50/00* (2014.12); *G06T 2219/008* (2013.01)

(56) References Cited

U.S. PATENT DOCUMENTS

| | | |
|---|---|---|
| 7,930,054 B2 | 4/2011 | Slaughter et al. |
| 8,983,189 B2 | 3/2015 | Dror et al. |
| 9,636,872 B2 | 5/2017 | Batchelder |
| 9,656,429 B1 | 5/2017 | Mantha et al. |
| 9,764,517 B2 | 9/2017 | Potter |
| 9,950,476 B2 | 4/2018 | Nguyen et al. |
| 10,086,467 B2 | 10/2018 | Burke et al. |
| 11,718,036 B2 | 8/2023 | Taig et al. |
| 2008/0250314 A1 | 10/2008 | Larsen |
| 2010/0088239 A1 | 4/2010 | Blair |
| 2011/0087350 A1 | 4/2011 | Fogel |
| 2013/0066812 A1 | 3/2013 | Nehme et al. |
| 2014/0156049 A1 | 6/2014 | Walker, Jr. |
| 2014/0253549 A1 | 9/2014 | Bachrach et al. |
| 2014/0271964 A1 | 9/2014 | Roberts, IV et al. |
| 2015/0045928 A1 | 2/2015 | Perez et al. |
| 2015/0151493 A1 | 6/2015 | Schmidt |
| 2015/0251356 A1 | 9/2015 | Batchelder |
| 2015/0269290 A1 | 9/2015 | Nelaturi et al. |
| 2016/0075089 A1 | 3/2016 | Royo et al. |
| 2016/0096318 A1 | 4/2016 | Bickel et al. |
| 2016/0171354 A1 | 6/2016 | Glasgow et al. |
| 2016/0176117 A1 | 6/2016 | Lee |
| 2017/0023929 A1 | 1/2017 | Matsuda |
| 2017/0050374 A1 | 2/2017 | Minardi et al. |
| 2017/0050382 A1 | 2/2017 | Minardi et al. |
| 2017/0066196 A1 | 3/2017 | Beard et al. |
| 2017/0120338 A1 | 5/2017 | Goeing |
| 2017/0165917 A1 | 6/2017 | Mckiel |
| 2017/0173888 A1 | 6/2017 | Thomas-lepore et al. |
| 2017/0220030 A1 | 8/2017 | Grube et al. |
| 2018/0056595 A1 | 3/2018 | Sterenthal |
| 2018/0275636 A1 | 9/2018 | Zhao et al. |
| 2019/0210109 A1 | 7/2019 | Chin |
| 2020/0324482 A1 | 10/2020 | Taig et al. |

FOREIGN PATENT DOCUMENTS

| | | |
|---|---|---|
| WO | 2019094218 A1 | 5/2019 |
| WO | 2019099547 A2 | 5/2019 |
| WO | 2020160214 A1 | 8/2020 |

OTHER PUBLICATIONS

International Search Report and Written Opinion for International Application No. PCT/US2018/061093, Search completed May 20, 2019, Mailed May 21, 2019, 12 pgs.

International Search Report and Written Opinion for International Application No. PCT/US2020/015806, Search Completed May 26, 2020, Mailed May 26, 2020, 7 pgs.

2100

INTERACTIVE SLICING METHODS AND SYSTEMS FOR GENERATING TOOLPATHS FOR PRINTING THREE-DIMENSIONAL OBJECTS

CROSS-REFERENCE

This application is a continuation of U.S. patent application Ser. No. 16/862,075, filed Apr. 29, 2020, which is a continuation of International Patent Application No. PCT/US18/61093, filed Nov. 14, 2018, which claims the benefit of U.S. Provisional Patent Application No. 62/585,901, filed Nov. 14, 2017, the disclosures of which is incorporated herein by reference in their entirety.

BACKGROUND

Additive manufacturing techniques such as 3D printing are rapidly being adopted as useful techniques for a host of different applications, including rapid prototyping and the fabrication of specialty components. Additive manufacturing is a process of creating three-dimensional parts by depositing overlapping layers of material under the guided control of a computer. Techniques of additive manufacturing include, without limitation, fused deposition modeling/fused filament fabrication (FDM/FFF), Plastic Jet Printing (PJP), stereolithography (SLA), selective laser sintering (SLS), selective laser melting (SLM), Joule printing and material jetting (MJ). Using Joule printing, a material may pass through a print head. The print head may be moved in a predefined trajectory (a.k.a., a tool path) as the material discharges from the print head, such that the material is laid down in a particular pattern and shape of overlapping layers. The material, after exiting the print head, hardens into a final form.

The process of generating a toolpath from a three-dimensional (3D) model is referred to as slicing. In particular, the 3D model of the part to be printed is sliced into multiple two-dimensional (2D) layers, which are then converted into machine code. The machine code is provided to the corresponding printer, allowing the printer to move the associated energy and/or material source in an x-y plane and print each overlapping layer of the part.

A variety of parameters that control the characteristics of the toolpath may be defined during slicing. Such parameters may be set based on factors such as the target printer, the materials being used, geometric features of the 3D model, or the desired properties of the printed part. However, these parameters can only be specified on a global manner. For example, users are not able to specify one or more parameters in an arbitrary portion within the part.

SUMMARY

The present disclosure provides systems and methods for interactive slicing, which may permit users to specify one or more parameters along a toolpath or for printing a 3D object at sub-slice level. A user may specify parameters in any arbitrary region or portion within a part. The user inputted instructions can be applied to a part at a plurality of levels. Such systems and methods may be used in three-dimensional printing.

Conventionally a 3D model is sliced into a plurality of 2D layers. A user may only modify parameters or settings for a layer or a part in a global manner. This may make it difficult to customize or control the performance of the printed part or the printing process with high accuracy or at granular level. However, the disclosed systems and methods advantageously enable such difficulty to be overcome. Systems and methods of the present disclosure may allow a fine-grained control of parameters for arbitrary portions of a part based on a hierarchical structure.

In one aspect, a method for printing a three-dimensional part is provided. The method may comprise: (a) receiving in computer memory a digital model of the three-dimensional object; (b) using one or more computer processors to partition the digital model of the three-dimensional part into a plurality of partitions, wherein a given partition of the plurality of partitions comprises a plurality of slices, and wherein a given slice of the plurality of slices comprises a plurality of segments; (c) receiving, from a user, one or more parameters that specify a printing configuration for at least one segment of the plurality of segments; and (d) generating printing instructions based at least in part on the one or more parameters, which printing instructions are usable by a print head to print the three-dimensional object.

In some embodiments, the print head is not an extruder. In some embodiments, the printing instructions are not extrusion instructions. In some embodiments, the method further comprises using the printing instructions to print the three-dimensional object. In some embodiments, the printing instructions actuate the print head or a support in accordance with the printing configuration.

In some embodiments, the method further comprises repeating (c) for other segments of the plurality of segments of the given slice. In some cases, the plurality of segments is arranged in an order within a plane such that (c) is performed sequentially according to the order.

In some embodiments, (b) comprises generating the plurality of slices and the plurality of segments. In some embodiments, the one or more parameters are received from the user through a user interface. In some cases, the user interface is a graphical user interface. In some cases, the user interface is configured to dynamically display a visual representation in response to receiving the one or more parameters. For example, the visual representation indicates the validity of the one or more parameters.

In some embodiments, the at least one segment of the plurality of segments is a polygon. In some embodiments, the polygon is a convex sub-polygon. In some embodiments, the polygon is a directionally convex sub-polygon.

In some embodiments, the method further comprises, in (b), partitioning the slice into the plurality of segments, wherein partitioning the slice into the plurality of segments comprises (i) reading vertices of said slice; (ii) saving, in a vertex set in computer memory, the vertices read in (i); (iii) while the vertex set is not empty: a. obtaining a subset of vertices comprising the convex sub-polygon; b. removing the subset of vertices from the vertex set; and c. storing the convex sub-polygon in a polygon set.

In some embodiments, obtaining the subset of vertices comprising the convex polygon further comprises (i) saving, in an edge set in computer memory, edges of the slice, wherein an edge connects two vertices of the slice; (ii) selecting a first edge and a second edge among the edges, wherein the first edge and the second edge are adjacent to one another; (iii) creating a diagonal edge from an end vertex of the second edge to a starting vertex of the first edge; (iv) while an angle between the first edge and the diagonal edge is less than 180 degrees: a. storing, in computer memory, the end vertex of the second edge, the starting vertex of the first edge, and an end vertex of the first edge in the subset of vertices; b. selecting a third edge, wherein a starting vertex of the third edge is the end vertex of the second edge; c. selecting a new first edge from the second edge; d. selecting a new second edge from the third edge; e. creating a new diagonal edge from the end vertex of the second edge to the starting vertex of the first edge. (v) selecting a fourth edge, adjacent to the first edge; (vi) repeating (iii) and (iv), wherein the fourth edge is substituted for the second edge.

In some embodiments, the polygon is a directionally convex sub-polygon.

In some embodiments, the method further comprises, in (b), partitioning the slice into the plurality of segments, wherein partitioning the slice into the plurality of segments comprises iterating, through multiple angular orientations of a segment: (a) merging one or more holes, if any, into the segment; (b) performing a splitting procedure to decompose the segment into a decomposition of multiple directionally convex sub-polygons; and (c) saving the decomposition of multiple directionally convex sub-polygons as a data structure; selecting the decomposition of multiple directionally convex sub-polygons.

In some embodiments, the polygon is rotated through 360 degrees in steps of two degrees per iteration.

In some embodiments, the selecting the decomposition of multiple directionally convex sub-polygons is for the decomposition with a smallest number of sub-polygons.

In some embodiments, merging one or more holes comprises, for each hole in the segment: (a) calculating distances between one or more contour vertices of the segment and the holes within the segment; (b) selecting a vertex-hole pair with a smallest distance; (c) inserting a diagonal connecting the vertex-hole pair; and (d) incorporating a plurality of vertices of the hole into the segment, the vertices of the hole comprising the circumference of the hole and the diagonal.

In some embodiments, the performing the splitting procedure comprises: (a) if the segment contains at least one pair including a split vertex and a merge vertex: (i) creating a line connecting one of the pairs of the at least one pair; (ii) partitioning the segment into two directionally convex sub-polygons; (iii) for each directionally convex sub-polygon of the two directionally convex sub-polygons, performing steps (a)-(c); (b) else if the segment contains a split vertex but not a merge vertex: (i) selecting a closest vertex above the split vertex and partitioning the segment into two directionally convex sub-polygons; (ii) for each directionally convex sub-polygon, performing steps (a)-(c); (c) else if the segment contains a merge vertex but not a split vertex: (i) selecting a closest vertex under the merge vertex and partitioning the segment into two directionally convex polygons; and (ii) for each directionally convex sub-polygon, performing steps (a)-(c).

In some embodiments, the split vertex is a vertex whose two neighbors lie below it and whose interior angle is greater than $\pi$. In some embodiments, the merge vertex is a vertex whose two neighbors lie above it and whose interior angle is greater than $\pi$.

In some embodiments, the method further comprises, for the slice, determining an order in which to print the plurality of segments.

In some embodiments, the method further comprises, in (d), the print instructions are generated based at least on the order and the one or more parameters.

In some embodiments, the determining the order comprises, while one or more layers contain unprinted segments: a. if no segments are printed within any layers, for a first segment within a first layer, selecting a start point; b. else if no segments are printed on a layer that is not the first layer, setting a start point that is an endpoint of a terminal segment of a previous layer; c. else if at least one segment is printed within a layer, each printed segment comprising a start point and an endpoint: i. while there are unprinted segments: a) determining a start point for each unprinted segment within the layer; b) selecting a closest start point to an endpoint of a most recently printed segment; and c) tracing a next segment, starting at the closest start point and stopping at an endpoint.

In some embodiments, determining the order includes determining a sequence which minimizes heat generated by the printer.

In some embodiments, determining the order includes determining a sequence which minimizes a number of lifting operations performed by the printer.

In some embodiments, determining the order includes determining a sequence which minimizes tool change operations.

In some embodiments, determining the order includes determining a sequence which minimizes material change operations.

In some embodiments, determining the order includes selecting one or more parameters, weighting the one or more parameters, calculating a score from the weighted parameters, and selecting a sequence of lifting operations which minimizes the score.

In some embodiments, the method further comprises using the printing instructions to print the three-dimensional object. In some embodiments, the one or more parameters comprise trace geometrics. In some cases, the trace geometrics comprise a trace pattern, a trace spacing or a scaling factor. In some examples, the trace pattern is selected from a plurality of trace patterns including but not limited to line fill, concentric fill and/or hatched fill.

In some embodiments, the printing configuration comprises voltage, current, pressure, force, feedstock feed rate, length of feedstock to consume, moving speed of the print head along a given deposition path, moving speed of the print head along a given non-deposition path, absolute coordinates of the print head, or relative coordinates of the print head. In some embodiments, the method further comprises setting the one or more parameters as a previously stored value without user input. In some cases, the previously stored value is a value set for a slice comprising the given segment. In some embodiments, the method further comprises receiving the one or more parameters for at least one given slice of the plurality of slices. In some cases, the one or more parameters comprise a slice thickness. In some cases, the method further comprises setting the one or more parameters as a previously stored value without user input. For example, the previously stored value is a value set for a partition comprising the given slice. Parameters might also be calculated based on other parameters and/or information from the 3D model.

In some embodiments, the method further comprises receiving the one or more parameters for at least one partition of the plurality of partitions. In some cases, the method further comprises setting the one or more parameters as a previously stored value without user input.

In another aspect, a system for printing a three-dimensional part is provided. The system comprises: computer memory comprising a digital model of the three-dimensional object; and one or more computer processors operatively coupled to the computer memory, wherein the one or more computer processors are individually or collectively programmed to: (a) partition the digital model of the three-dimensional part into a plurality of partitions, wherein a given partition of the plurality of partitions comprises a plurality of slices, and wherein a given slice of the plurality of slices comprises a plurality of segments; (b) receive, from a user, one or more parameters that specify a printing configuration for at least one segment of the plurality of segments; and (c) generate printing instructions based at least in part on the one or more parameters, which printing instructions are usable by a print head to print the three-dimensional object.

In some embodiments, the system further comprises a print head that uses the printing instructions to print the three-dimensional object. In some embodiments, the printing instructions are configured to actuate the print head or a support in accordance with the printing configuration. In some embodiments, the one or more computer processors are individually or collectively programmed to repeat (b) for other segments of the plurality of segments of the given slice. In some embodiments, the one or more computer processors are individually or collectively programmed to iteratively perform (b) and (c) for other segments of other slices of other partitions of the plurality of partitions. In some embodiments, the one or more computer processors are individually or collectively programmed to receive the one or more parameters from the user through a user interface. In some cases, the user interface is configured to dynamically display a visual representation in response to receiving the one or more parameters. In some examples, the visual representation indicates a validity of the one or more parameters.

In some embodiments, the printer is configured to print said three-dimensional object at least in part by (i) bringing a feedstock in contact with a platform or a previously deposited layer of the three-dimensional object, and (ii) directing electrical current to flow from the feedstock and into the platform or the previously deposited layer of the three-dimensional object, or vice versa, to melt at least a portion of the feedstock and deposit at least the portion of the feedstock adjacent to the platform or the previously deposited layer of the three-dimensional object, thereby forming at least a portion of the three-dimensional object.

In another aspect, a non-transitory computer readable medium comprising machine executable code that, upon execution by one or more computer processors, implements a method for printing a three-dimensional object. The method may comprise: (a) receiving in computer memory a digital model of the three-dimensional object; (b) using one or more computer processors to partition the digital model of the three-dimensional object into a plurality of partitions, wherein a partition of the plurality of partitions comprises a plurality of slices, and wherein a slice of the plurality of slices comprises a plurality of segments; (c) receiving, from a user, one or more parameters that specify a printing configuration for at least one segment of the plurality of segments; and (d) generating printing instructions based at least in part on the one or more parameters, which printing instructions are usable by a printer to print the three-dimensional object.

Another aspect of the present disclosure provides a non-transitory computer readable medium comprising machine executable code that, upon execution by one or more computer processors, implements any of the methods above or elsewhere herein.

Another aspect of the present disclosure provides a system comprising one or more computer processors and computer memory coupled thereto. The computer memory comprises machine executable code that, upon execution by the one or more computer processors, implements any of the methods above or elsewhere herein.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

INCORPORATION BY REFERENCE

All publications, patents, and patent applications mentioned in this specification are herein incorporated by reference to the same extent as if each individual publication, patent, or patent application was specifically and individually indicated to be incorporated by reference. To the extent publications and patents or patent applications incorporated by reference contradict the disclosure contained in the specification, the specification is intended to supersede and/or take precedence over any such contradictory material.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings (also "Figure" and "FIG." herein), of which:

DETAILED DESCRIPTION

Figure 1:
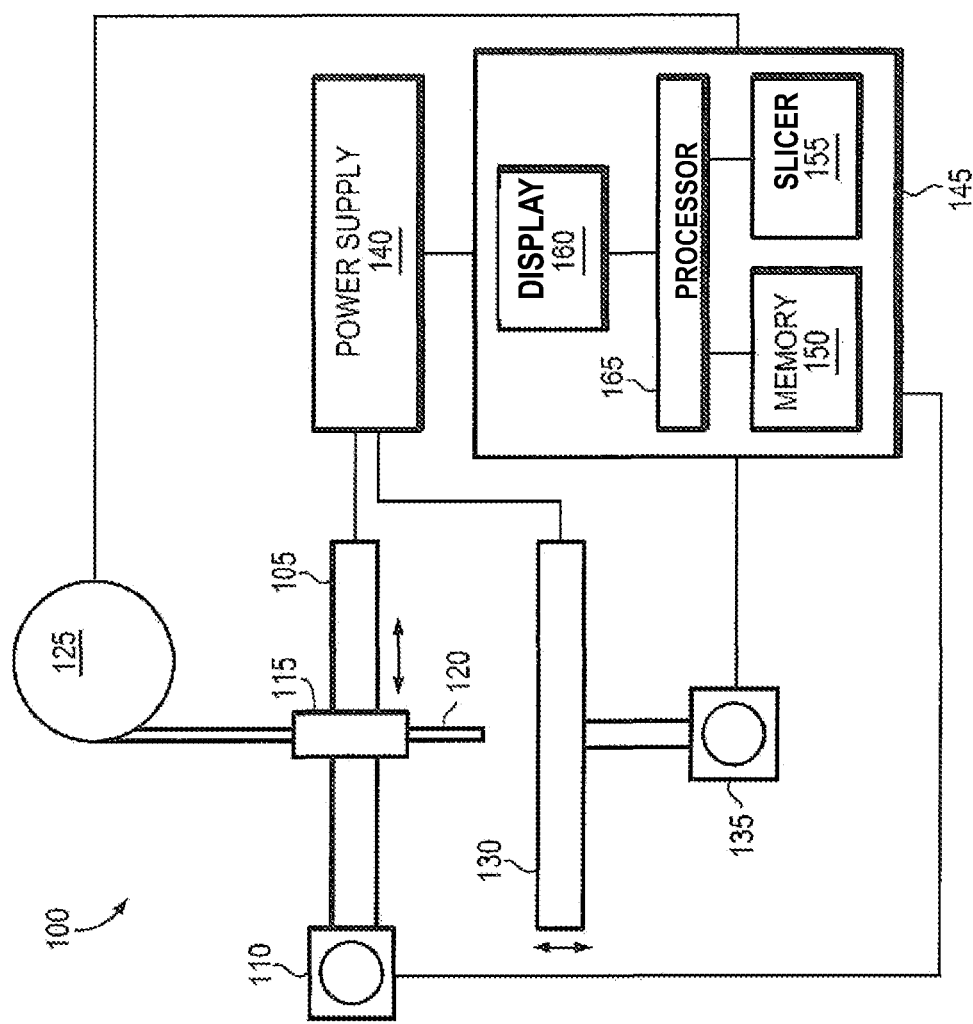
FIG. 1 is a schematic of an additive manufacturing apparatus in accordance with various embodiments of the present disclosure.

While various embodiments of the present disclosure have been shown and described herein, it will be obvious to those skilled in the art that such embodiments are provided by way of example only. Numerous variations, changes, and substitutions may occur to those skilled in the art without departing from the invention. It should be understood that various alternatives to the embodiments of the present disclosure described herein may be employed.

The term "three-dimensional printing" (also "3D printing"), as used herein, generally refers to a process or method for generating a 3D object (or part). The 3D object may be at least a portion of a larger 3D object or an entirety of the 3D object. 3D printing may refer to sequential addition of a material layer or joining of material layers or parts of material layers to form a three-dimensional (3D) part or structure, in a controlled manner (e.g., under automated control). 3D object may involve additive manufacturing. In the 3D printing process, the deposited material can be fused, sintered, melted, bound or otherwise connected to form at least a part of the 3D object. Fusing the material may include melting or sintering the material. Binding can comprise chemical bonding. Chemical bonding can comprise covalent bonding. Examples of 3D printing include additive printing (e.g., layer by layer printing, or additive manufacturing). The 3D printing may be subtractive printing, which may involve removal of material (e.g., cutting or machining a feedstock) to yield a 3D object.

The term "partition," as used herein, generally refers to a piece, portion, or part of a 3D object, a representation of the 3D object (e.g., computer model), or an object corresponding to the 3D object or a portion of the 3D object. The partition may be generated for use in a print job to print the 3D object.

Whenever the term "at least," "greater than," or "greater than or equal to" precedes the first numerical value in a series of two or more numerical values, the term "at least," "greater than" or "greater than or equal to" applies to each of the numerical values in that series of numerical values. For example, greater than or equal to 1, 2, or 3 is equivalent to greater than or equal to 1, greater than or equal to 2, or greater than or equal to 3.

Whenever the term "no more than," "less than," or "less than or equal to" precedes the first numerical value in a series of two or more numerical values, the term "no more than," "less than," or "less than or equal to" applies to each of the numerical values in that series of numerical values. For example, less than or equal to 3, 2, or 1 is equivalent to less than or equal to 3, less than or equal to 2, or less than or equal to 1.

Methods and systems for generating a 3D object

A 3D object may be created by layering and connecting successive cross-sections of material. Printer resolution describes layer thickness and x-y resolution in dots-per-inch (DPI) or micrometers (μm). Typical layer thickness is around 100 μm (250 DPI)), although some machines can print layers as thin as 16 μm (1,600 DPI)). The x-y resolution is comparable to that of laser printers. The particles created are volumetric pixels, which has generated the term "Voxels," (3D dots), and are generally around 50 to 100 μm, (510 to 250 DPI, or "Voxels Per Inch"—"VPI"), in diameter, the term "VPI" implying that the dimensions may be cubic.

Examples of 3D printing methodologies comprise extrusion, wire, granular, laminated, light polymerization, or power bed and inkjet head 3D printing. Extrusion 3D printing can comprise robo-casting, fused deposition modeling (FDM) or fused filament fabrication (FFF). In some cases, the 3D printing may be performed without extrusion. For example, beads may be deposited (e.g., in FFF) in a manner that does not involve extrusion. Wire 3D printing can comprise electron beam freeform fabrication (EBF3). Granular 3D printing can comprise direct metal laser sintering (DMLS), electron beam melting (EBM), selective laser melting (SLM), selective heat sintering (SHS), Joule Heating, or selective laser sintering (SLS). Power bed and inkjet head 3D printing can comprise plaster-based 3D printing (PP). Laminated 3D printing can comprise laminated object manufacturing (LOM). Light polymerized 3D printing can comprise stereo-lithography (SLA), digital light processing (DLP) or laminated object manufacturing (LOM). In some cases, gas metals arc welding (GMAW), resistive spot welding (RSW), and computer-aided manufacturing (CAM) technologies may be employed for printing a 3D metallic structure. For example, inert gas shielding and a fine metal wire electrode may be utilized as both an electrode and source of metal feedstock (similarly to GMAW), an electric current that heats and melts the feed metal and base metal due to contact resistance (similarly to RSW), and can control the motion of the metal wire electrode/feedstock in three dimensions through a computer-controlled interface, allowing for deposition of material in the predetermined shape (similarly to CAM).

3D printing may be performed using various materials. In some examples, a material that may be used in 3D printing includes a polymeric material, elemental metal, metal alloy, a ceramic, an allotrope of elemental carbon, or a combination thereof. The allotrope of elemental carbon may comprise amorphous carbon, graphite, graphene, diamond, or fullerene. The fullerene may be selected from the group consisting of a spherical, elliptical, linear, and tubular fullerene. The fullerene may comprise a buckyball or a carbon nanotube. The material may comprise an organic material, for example, a polymer or a resin. The material may comprise a solid or a liquid. The solid material may comprise powder material. The powder material may be coated by a coating (e.g., organic coating such as the organic material (e.g., plastic coating)). The powder material may comprise sand. The material may be in the form of a powder, wire, pellet, or bead. The material may have one or more layers. The material may comprise at least two materials. In some cases, the material may comprise metal wire that may include, for example, stainless steel, copper, and/or aluminum. The material may incorporate more than one type of feedstock.

An object to be printed may be either scanned or created via three-dimensional rendering software. 3D printable models may be created with a computer aided design package, or via a 3D scanner, or via a plain, digital camera, and photogrammetry software. The manual modeling process of preparing geometric data for 3D computer graphics is similar to other plastic parts such as mold making and sculpting. 3D scanning is a process of analysis and collection of topographical, digital data of the surface shape and appearance of a real object. Based on this data, three-dimensional models of the scanned object can then be produced.

In some cases, regardless of the 3D modeling software used, the 3D model (e.g., in .skp, .dae, .3ds or some other format), needs to be converted to either an .STL or an .OBJ format, to allow the printing software to be able to read it and deposit layers according to the build material, tolerances and other aspects. Such build material or tolerances may be determined by a user. STL is a file format native to the stereolithography CAD (Computer-Aided Design) software created by the "3D Systems®" company located in the United States. This file format is supported by many other software packages; it is widely used for rapid prototyping and computer-aided manufacturing. STL files describe the surface geometry of a three dimensional object without representation of color, texture, or other common CAD model attributes. The STL format specifies both ASCII (American Standard Code for Information Interchange) and binary representations. Generally, binary files are more common, since they are usually more compact. Also, generally, each STL file describes a raw unstructured triangulated surface by the unit normal and vertices (ordered by the right-hand rule) of the triangles using a three-dimensional Cartesian coordinate system. Various other formats may be used such as Additive Manufacturing File Format (AMF), Polygon File Format (PYF) and the like.

The .STL file or the AMF file may be processed by a software stage called a "slicer." A conventional slicer may convert the model into a series of thin layers automatically. The layers are generated at the thickness appropriate for the predetermined build material and resolution. 3D printers convert software printing commands into machine-readable instructions. For example, slicer commands may be converted directly into machine code. For example, a specific 3D printer may be provided tailored instructions by a G-code file. A vast majority of contemporary 3D printers execute printing commands and perform head path-planning using the numerical control programming language G-Code. Indeed, G-Code remains an industry standard for controlling automated machine tools, e.g., a 3D printer, during computer-assisted manufacturing. However, different programming techniques may be required to transform user-input parameters into printing parameters, and, moreover, into head path-planning. A G-Code may send discrete pulses to an electric motor, and thereby allows the user to control machine movement. In 3D printing, it instructs mechanical movement in the machine during the 3D printing process.

In some cases, 3D object may be fabricated layer-by-layer using an apparatus 100, as shown in FIG. 1. The apparatus may be a 3D printer. The 3D printer 100 may be in communication with at least one computing device 145. In some cases, 3D printer 100 may be configured to create part under the guided control of computing device 145, for example by way of an additive manufacturing process. Although a metallic wire 3D printing process will be described below as one example of how part may be created or generated, other processes may be utilized for this purpose. Other examples of methods, systems and materials that may be used to create or generate objects or parts are described elsewhere herein. The 3D printer may be a powder based printer (e.g., laser sintering or binder based printing) or a fused deposition modeling printer. The printer may be configured to generate a part by bringing feedstock in contact with a support or a previously deposited layer(s) of the 3D object and directing electrical current to flow through the feedstock and into the support or the previous deposited layer(s), or vice versa, as described in, for example, U.S. Pat. No. 10,086,467 B2, which is entirely incorporated herein by reference. The printer may also print on the surface of an already printed part, for example, to add additional features to the part.

The apparatus 100 may comprise a mechanical gantry 105 capable of motion in one or more of five or six axes of control (e.g., one or more of the XYZ planes) via one or more actuators 110 (e.g., motors such as linear motors). As shown, apparatus 100 may also comprise a wire feeder 115 that positions a metal wire 120 inside the apparatus, provides an electrical connection to the metal wire 120, and continuously feeds metal wire 120 from a source 125 (e.g., a spool) into the apparatus. A baseplate 130 may be positioned inside the apparatus and provides an electrical connection; the vertical motion of the baseplate 130 may be controlled via an actuator 135 (e.g., a motor such as a stepper motor). An electric power supply 140 may connect to the metal wire 120 and the baseplate 130, enabling electrical connection therebetween. The motion of the gantry 105 and the motion of the wire feeder 115 may be controlled by the computing device or the controller 145. The application of electric current from the power supply 140, as well as the power level and duration of the current, may also be controlled by the controller 145.

The computer-based controller 145 in accordance with embodiments of the present disclosure may comprise, for example, a computer memory 150 and a slicer 155. Computational representations of 3D structures may be stored in the computer memory 150, and the slicer 155 may partition the computational representation of 3D structure into thin layers or segments and produce a G-code containing instructions tailored to the 3D printer 100. The controller 145 may control the mechanical actuators 110, 135, wire-feeding mechanism 115, and power supply 140 to form successive layers deposited metal particles in accordance with the data.

The slicer provided may allow a fine-grained control of parameters for arbitrary or predetermined sections of a part based on a hierarchical structure. The slicer may be an interactive slicer that allows a user to input parameters for arbitrary or predetermined sections of a part. Such parameters may be inputted prior to printing or while printing a 3D object. Such parameters may be inputted and adjusted, either manually by a user or in accordance with various rules. Such parameters may be set without user input, or automatically generated by computer software.

Any number of separate computing devices 145 may implement the interactive slicer. Computing device 145 may include a display 160, one or more computer processors ("processors") 165, any number of input/output ("I/O") devices, and one or more memories 150 for storing one or more executable programs and data. Programs may include, for example, any number of slicer applications or software 155 and an operating system. The display 160 may include a user interface, such as a graphical user interface, which may permit a user to input parameters.

Display 160 of computing device 145 may include a liquid crystal display (LCD), a light emitting diode (LED) screen, an organic light emitting diode (OLED) screen, and/or another display device. Display 160 may be used for display of data, visual presentations, user interface or receive user input under the control of processor 165.

Computer processor ("processor") 165 may be a single or multi-core processor, in some cases configured with virtual processing technologies, and use logic to simultaneously execute and control any number of operations. Processor 165 may be configured to implement virtual machine or other technologies to execute, control, run, manipulate, and store any number of software modules, applications, programs, etc. In addition, processor 165 may include one or more specialized hardware, software, and/or firmware modules (not shown) specially configured with particular circuitry, instructions, algorithms, and/or data to perform functions of the disclosed methods. The processor 165 that executes commands and instructions may be a general-purpose computer processor, but may utilize any of a wide variety of other technologies including special-purpose hardware, a microcomputer, mini-computer, mainframe computer, programmed micro-processor, micro-controller, peripheral integrated circuit element, a CSIC (Customer Specific Integrated Circuit), ASIC (Application Specific Integrated Circuit), a logic circuit, a digital signal processor, a programmable logic device such as an FPGA (Field Programmable Gate Array), PLD (Programmable Logic Device), PLA (Programmable Logic Array), RFID processor, smart chip, or any other device or arrangement of devices that is capable of implementing the operations of the processes of embodiments of the present disclosure. In some cases, the slicer and a controller of the printer are implemented using a single processor. In some cases, the slicer and a controller of the printer are implemented using separate processors. It is appreciated that other types of processor arrangements may be implemented that provide for the capabilities disclosed herein.

Memory 150 can be a volatile or non-volatile, magnetic, semiconductor, tape, optical, removable, non-removable, or other type of storage device or tangible and/or non-transitory computer-readable medium that stores programs, such as the slicer 155 and operating system. Common forms of non-transitory media include, for example, a flash drive, a flexible disk, a hard disk, a solid state drive, magnetic tape or other magnetic data storage medium, a CD-ROM or other optical data storage medium, any physical medium with patterns of holes, a RAM, a PROM, and EPROM, a FLASH-EPROM or other flash memory, NVRAM, a cache, a register or other memory chip or cartridge, and networked versions of the same.

Memory 150 may store instructions that enable processor 160 to execute one or more applications, such as the slicer 155 and operating system, and any other type of application or software available or executable on computer systems. Alternatively or additionally, the instructions, application programs, etc. can be stored in an internal and/or external database (e.g., a cloud storage system—not shown) that is in direct communication with computing device 145, such as one or more databases or memories accessible via one or more networks (not shown). Memory 150 can include one or more memory devices that store data and instructions usable to perform one or more features provided herein. Memory 150 can also include any combination of one or more databases controlled by memory controller devices (e.g., servers, etc.) or software, such as document management systems, Microsoft SQL databases, SharePoint databases, Oracle™ databases, Sybase™ databases, or other relational databases. Data related to a slicing process may be stored in the one or more databases. Details regarding the data related to the slicing process are discussed later herein.

Computing device 145 may be communicatively connected to one or more remote memory devices (e.g., remote databases—not shown) through a network. The remote memory devices can be configured to store information that computing device 145 can access and/or manage. By way of example, the remote memory devices may be document management systems, Microsoft SQL database, SharePoint databases, Oracle™ databases, Sybase™ databases, Cassandra, HBase, or other relational or non-relational databases or regular files. Systems and methods provided herein, however, are not limited to separate databases or even to the use of a database.

The slicer 155 may include one or more software or firmware modules causing processor 165 to perform one or more functions disclosed herein. Moreover, processor 165 can execute one or more programs located remotely from computing device 145. For example, computing device 145 can access one or more remote programs that, when executed, perform one or more functions disclosed herein. In some cases, programs stored in memory 150 and executed by processor 165 can include a slicer 155 and operating system. The slicer 155 may cause processor 165 to perform one or more functions of the disclosed methods.

Operating system may perform operating system functions when executed by one or more processors such as processor 165. By way of example, operating system may include Microsoft Windows™, Unix™, Linux™, OSX™, and IOS™ operating systems, Android™ operating systems, or another type of operating system. Accordingly, disclosed embodiments can operate and function with computer systems running any type of operating system.

An I/O device may include one or more interfaces for receiving signals or input from a user and/or printer 100, and for providing signals or output to printer 100 that allow part to be printed. For example, computing device 145 can include interface components for interfacing with one or more input devices, such as one or more keyboards, mouse devices, and the like, which enable computing device 145 to receive input from a user (not shown).

Methods for partitioning a 3D model

Figure 2:
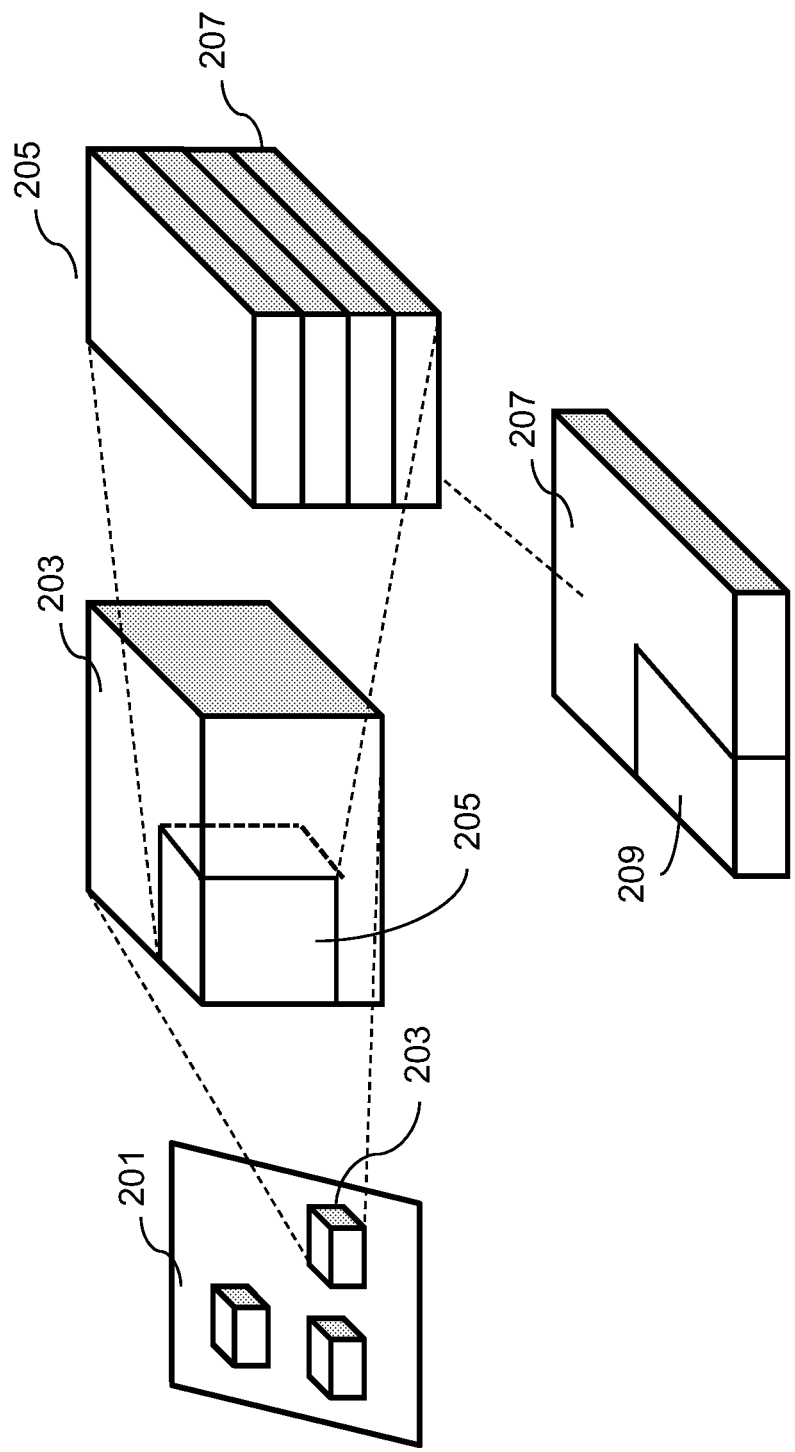
FIG. 2 shows an exemplary partitioning hierarchy, in accordance with embodiments of the present disclosure.

In one aspect, a 3D model of a part may be partitioned into a plurality of elements according to a hierarchical structure. The plurality of elements may be arranged into multiple levels according to a hierarchy. In some cases, the finest element may be a segment. The 3D model of a part may be partitioned by a slicer. FIG. 2 shows an exemplary partitioning hierarchy, in accordance with embodiments of the present disclosure.

A printing job 201 may comprise 3D model of one or more parts 203. The term "part," as used herein, generally refers to an object. A part may be generated using 3D printing methods and systems of the present disclosure. A part may be a portion of a larger part or object, or an entirety of an object. A part may have various form factors, as may be based on a model of such part. Such form factors may be predetermined.

3D model of a part may be partitioned into a plurality of elements according to a hierarchy. In some cases, the finest element may be a segment. The hierarchy may comprise a plurality of levels. In an example, the hierarchy may include partitioning 3D model of a part into one or more pieces, each piece may be partitioned into one or more slices, and each slice may be partitioned into one or more segments. Various other hierarchical structures may be employed. For instance, a job may be partitioned into one or more thin layers that each of which may intersect one or more parts or pieces, then each layer may be partitioned into a plurality of segments.

As illustrated in the example, upon receiving, in computer memory, a job file 201 comprising computer model of one or more parts 203, the computer model of each of the parts may be partitioned. The computer model of the part can be partitioned into one or more pieces 205. The one or more pieces may be determined according to one or more characteristics of the part. For example, a part may be partitioned into multiple pieces based on different materials used for different pieces, complexity, color or functionality of different pieces. In an example, a multi-metal bushing part may be partitioned into two pieces—one piece may be the aluminum casing and the other piece may be the bronze sleeve.

A piece 205 may comprise any shape, geometry or dimension. A part can be a single piece. A part may comprise multiple pieces that may or may be the same. A piece 205 may have a volume. A piece 205 may comprise any arbitrary or predetermined three-dimensional shape that needs not be a prism. A piece may be from any arbitrary or predetermined region or any portion of a part.

In some embodiments, a piece may further be partitioned into a plurality of slices 207. The plurality of slices may or may not have uniform thickness. In some cases, the plurality of slices may have uniform thickness. Alternatively, the plurality of slices may have variable thickness. For instance, the thickness of the slices may vary according to complexity of the piece structure or resolution requirement of different region of the piece. In some cases, a slice may correspond to a cross-section of the piece which may have any shape depending on the piece structure. The plurality of slices are shown as horizontal layers in the figure, however, these slices may be sliced along any direction that may or may not be vertical with respect to ground level or a print head direction.

In some embodiments, a slice may be partitioned into a plurality of segments 209. A segment may have the same thickness and height as the slice. A slice may or may not be uniformly divided into the plurality of segments 209. In some cases, a slice may be divided into a plurality of segments with preset width and length. The plurality of segments may comprise any shape, such as circular, rectangular, triangular, square, polygonal, or partial shapes or combination of shapes thereof, or various other shapes. The shape of the segment may be preset or predetermined by a user. The segment may have any dimension. The segment may have a dimension or size sufficiently small such that a user may specify one or more parameters for any arbitrary or predetermined portion/region of a part, such as a portion/region selected by a user.

As mentioned above, a job can be partitioned based on various other hierarchies. For example, a job may be partitioned into a plurality of layers and each layer may be further partitioned into a plurality of segments. When the job comprises multiple parts or pieces, a layer may comprise segments from different pieces or parts.

Figure 3:
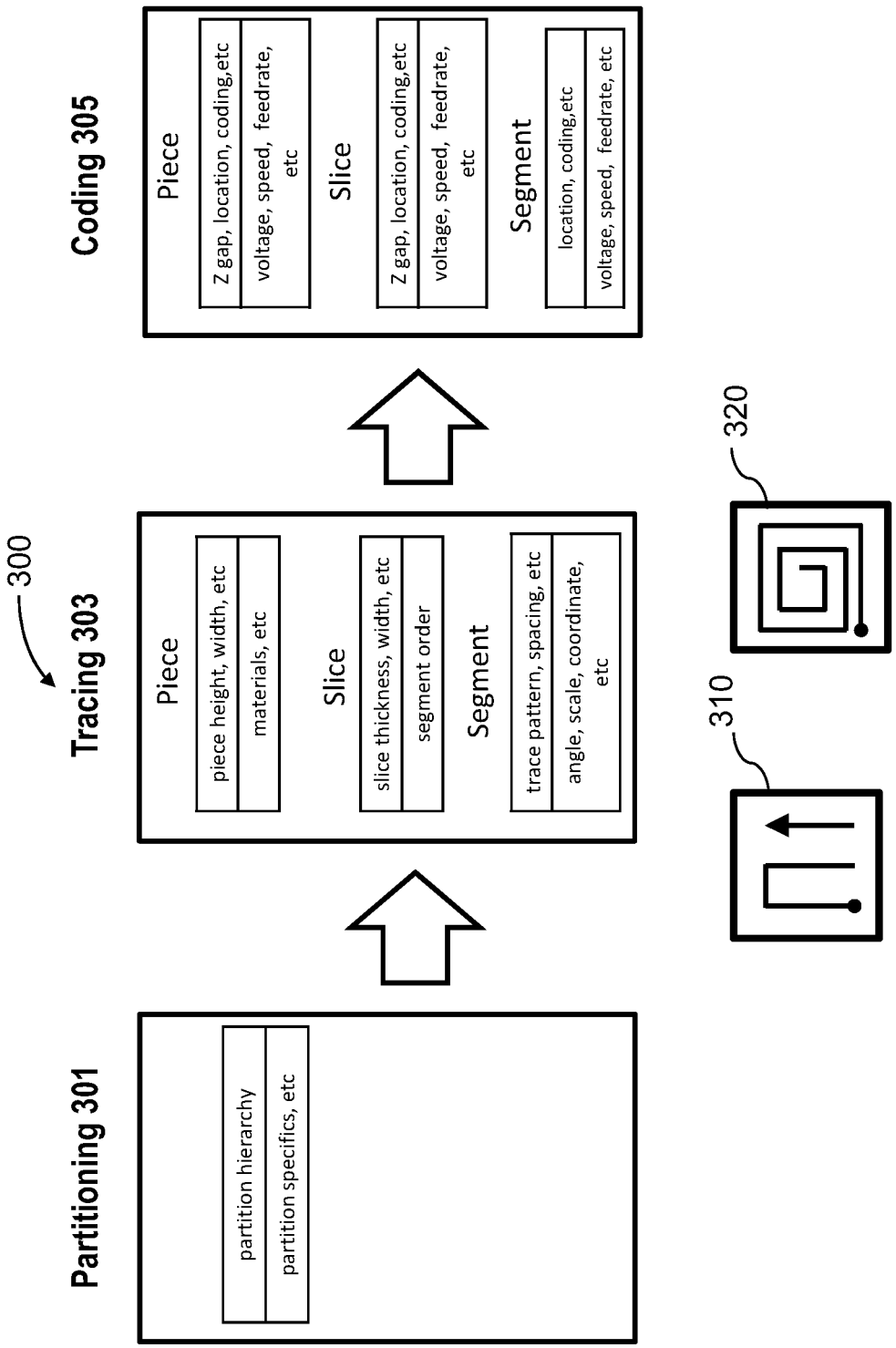
FIG. 3 shows exemplary user inputted parameters for different levels at different operations of a slicing process, in accordance with embodiments of the present disclosure.

A user may modify or set one or more parameters at the various levels of the hierarchy. The one or more parameters may be inputted at one or more operations of a slicing process. FIG. 3 shows exemplary user inputted parameters for different levels at different operations of a slicing process 300, in accordance with embodiments of the present disclosure.

A slicing process 300 may comprise multiple operations. For example, a slicing process may comprise partitioning a 3D model according to a hierarchy, generating toolpath along with one or more parameters, and producing numerical control programming codes (e.g., G-code) of the partitioned computer model. One or more parameters may be provided by a user for at least one of the operations. One or more parameters related to the one or more operations may be provided by a user in an interactive environment. A slicing process may comprise less or more operations than the operations described above. A slicing process may comprise other operations pertaining to generating fabrication instructions to a 3D printer, analysis of a 3D model and the like.

In some embodiments, upon receiving a 3D model or a job file, the slicer may partition the job or the 3D model according to a hierarchy as described above 301. The hierarchy may comprise a plurality of levels as described elsewhere herein. For example, a job may comprise one or more parts, each part may be partitioned into one or more pieces, each piece may be partitioned into a plurality of slices, and each slice may be partitioned into a plurality of segments. The 3D model or job file may be a computer aided design (CAD) model. For example, the CAD model may comprise geometric s of the part and design requirements. The geometry of the CAD model may be received by way of I/O devices.

In some cases, the design requirements may be used for identifying one or more pieces of a part. For instance, a part may be partitioned into a plurality of pieces according to different physical characteristics of the pieces that are defined by the design requirements. Design requirements can be selected from a group that includes, for example, strength, structural deflections, stress, strain, tension, shear, load capacity, stiffness, factor-of safety, weight, strength to weight ratio, envelop geometry, minimal print time, thermal performance, thermal capacitance, thermal conductance, electrical performance, electrical capacitance, electrical inductance, electrical resistance, porosity, infill, number of shells, layer height, extruder temperature, solid density, melt density, printing speed, print head movement speed, or the material and density to direct heat through a specific area of the part and the like.

The CAD model can comprise one or more geometric features of the part that is selected from the group consisting of corners, edges, surfaces, solids, ridges, salient points, and image texture. The geometric features can define the form, fit, and function of the 3D printed part. The geometry features may comprise tolerance information, for example, certain regions that are not critical to the form, fit, or function of the part may be adjusted to improve performance or optimize the part's properties.

The CAD model may be automatically partitioned by the slicer according to a preset hierarchy. For example, one or more parts and one or more pieces of each part may be automatically identified by the slicer as described above, then each piece may be partitioned into a plurality of slices based on preset slicing rules, and each slice may be partitioned into a plurality of segments based on the preset slicing rules. The preset slicing rules may comprise, for example, a set of predetermined geometrics of the slices, segments, or rules of partitioning according to the geometry features or design requirement provided by the CAD model. Alternatively, a user may specify one or more parameters related to partitioning. The one or more parameters related to partitioning may include, for example, a partition hierarchy, partition specifics, arrangement of the partitioned portions and the like. For example, a user may select a partition hierarchy from a part-piece-slice-segment hierarchy, a job-layer-segment hierarchy or others. In another example, a user may set the number of pieces, specify a specific region as a piece, or define an arrangement or order of a plurality of segments in a layer or a slice and the like. In another example, a user may input an instruction to further partition a current segment, piece or part. For instance, a user may select the current segment (e.g., click on the current segment on a user interface displaying the current segment), piece or part, and draw a line or pattern to indicate the coordinate and shape of a parting/split line or boundary of the current segment, piece or part. Additionally, a user may merge any two or more segments or pieces.

The partitioned 3D model may then be processed for generating a toolpath and one or more instructions or parameters along the toolpath during a tracing operation 303. One or more parameters associated with the tracing operation 303 may be provided for each element at different levels. The different levels may be determined by the hierarchy selected by the user during the previous operation or determined by a preset hierarchy. In an example, the different levels may comprise segment, slice, piece, part and job as described elsewhere herein. A user may input or modify one or more parameters associated with each element from each level.

In some cases, the one or more parameters associated with a segment may be related to a trace within the segment. A trace may be the trajectory a print head moves along during printing. The trajectory may be adjusted prior to printing or during printing in real-time. The trajectory may be adjusted manually by a user, automatically in accordance with pre-defined conditions. The trajectory may be adjusted as part of feedback control during printing (e.g., sensor measurements made during printing may be used to adjust the trajectory).

Additionally, a trace may be a trajectory of relative movement between a print head and a stage that supports the part. The one or more parameters related to a trace may comprise, for example, trace pattern (e.g., rectilinear pattern 310, concentric 320, hatched, raster, line, zig zag, etc.), spacing of the trace, and the like. The one or more parameters may also include allowing a user to manually create or modify a pattern, such as drawing any arbitrary pattern in a location selected by a user, or edit any fraction of a pattern within the segment. A user may manually edit or modify a shape, dimension or coordinates of a trace pattern. For instance, when the shapes are represented as polygons, which consist of an exterior (outside perimeter) and one or more interiors (hole perimeter), the exterior and interiors are lists of x-y coordinates. To manually edit a shape, the user may change the values of these coordinates, or by drag-and-drop control of the vertex at the given x-y coordinate. Alternatively, exact numeric values for the coordinates can be entered by inputting the numbers. The one or more parameters may also relate to transformation factors of the trace such as a rotational angle, scale factor, translation, shift, affine transformations, coordinates of the start/end point of the trace and various others.

The one or more parameters can be in any format. For example, the one or more parameters may be numerical numbers comprising any suitable digits, texts, alphanumeric characters, visual representations, plots, diagrams, and the like.

The one or more parameters may be adjusted, selected, modified or inputted by a user in various forms. Any suitable form may be used to adjust the one or more adjustable parameters, such as drop-down list, slider bars, tables, charts, pictorial representations, direct input and the like.

In some cases, the one or more parameters associated with a slice may be related to geometric s of a slice and/or arrangement of a plurality of segments within the slice. The slice can be any given slice selected by a user from a plurality of slices. The one or more parameters associated with the given slice need not have the same value as the parameters associated with other slices. For example, a thickness of a bottommost slice of a sacrificial raft structure (i.e., the layer of the sacrificial raft structure directly in contact with the base) may be greater than a thickness of at least one of, or even all of, the slices of the structure. The one or more parameters related to the given slice geometrics may comprise, for example, thickness of the slice, spacing of the slice, or width/length of the slice and the like. The one or more parameters may also relate to an arrangement of a plurality of segments within the slice. For example, a user may determine an order of the arrangement of the segments. The order may determine a fabrication order and/or order of receiving user inputted parameters sequentially. The one or more parameters applied to a segment may also be applied to a slice. For instance, a user may modify one or more parameters related to transformation factors of a trace within the slice, such as rotational angle, scale factor, translation, shift, affine transformations, coordinates of the start/end point of the trace and various others. Similarly, a user may manually edit or create any arbitrary pattern in a user selected coordinate within the slice in a manner described above.

In some cases, the one or more parameters associated with a piece may be related to geometrics of a piece. The piece can be any given piece selected by a user from a plurality of pieces. The one or more parameters associated with the given piece need not have the same value as the parameters associated with other pieces. The one or more parameters related to the given piece geometrics may comprise, for example, height of the slice, width/length of the piece, location of the piece relative to other pieces or the part and the like. In some cases, the one or more parameters may also include parameters constrained or be related to design requirements. The one or more parameters may include, for example, porosity, infill percentage, infill pattern, raster angle, or build orientation and various others. Optionally, such parameters can also be defined at the segment, slice, part and/or job level.

One or more parameters can be modified or inputted by a user during a coding operation. One or more numerical control programming code of the partitioned computer model may be generated during the coding operation. The numerical control programming code can comprise, for example, G-code files and intermediate files. The G-code files may comprise one or more parameters related to rapid movement, controlled feed in an arc or straight line, series of controlled feed movements, switch coordinate systems, set of tool information and the like. The intermediate files can comprise supplemental files, tools for a primary build output, automatically generated source files, or build output from helper tools.

One or more parameters can be specified or inputted by a user during the coding operation. The one or more parameters may be associated with a plurality of elements of different levels such as segment, slice, piece, part, and/or job. A use may set a value of a parameter for a segment, a slice, a piece, a part or a job depending on the hierarchy. The one or more parameters may be related to printing configurations specific to the printer, print head movement, and/or coding. The one or more parameters may be the parameters comprised by the the G-code. The one or more parameters may be related to generating a G-code.

In some cases, a user may specify one or more parameters related to printing process parameters, print head movement, coding and various variables defined in the numerical control programming code for a segment. The printing process parameters specific to the associated printer may include, for example, voltage, current, feedstock feed rate, length of filament to consume, temperature of a support, temperature of feedstock, wire's retraction speed, diameter or wire, heat during deposition, spacing between a feedstock and a support, extrusion pressure, extruder angle, nozzle temperature, extrusion speed, head temperature, dwell time before printing, dwell time after printing, applied extrusion pressure (which may be applied pneumatically or volumetrically), retraction technique, minimum nozzle size, and various other fabrication instructions pertaining to the specific printing technologies employed. The parameters related to the print head motion may include, for example, (maximum) speeds and accelerations for each axis, moving speed of the print head along a given deposition path, moving speed of the print head along a given non-deposition path, gap along height direction, coordinates of a start or end point, angle or orientation of the print head, and various other factors. In some cases, the parameters may also be related to a movement or orientation of the stage that supports a part to be printed. The movement of the stage may have one, two, three or more degrees of freedom. The movement of the stage may be translational movement and/or rotational movement with respect to one or more axes (e.g., x, y, z axes). The parameters related to coding may include, for example, start and end of the program, type of coder, tool index, and various other program functions or variables.

In some cases, the one or more parameters as described above can be specified or adjusted by a user for a slice, a layer, a piece, a part and/or a job. A user may modify one or more of the parameters at different levels. In some cases, a user may set default values for one or more of the parameters. In some cases, the default values may be a value previously received at a different level. For instance, the default value of the moving speed for a segment may be set as the value defined for the slice comprising the segment. Similarly, the default value of the feedstock feed rate for a segment may be set as the feedstock feed rate defined for the layer.

In some cases, the numerical control programming code may be generated for each segment. A plurality of the numerical control programming codes associated with the plurality of segments may be combined to generate the numerical control programming code for a slice or a layer. In some cases, additional instructions may be added to the combined code for the slice. In some cases, a plurality of numerical control programming codes associated with a plurality slices/layers may be combined to generate the numerical control programming code for a piece/part. Similarly, additional instructions may be added to the combined code for the piece/part.

Figure 4:
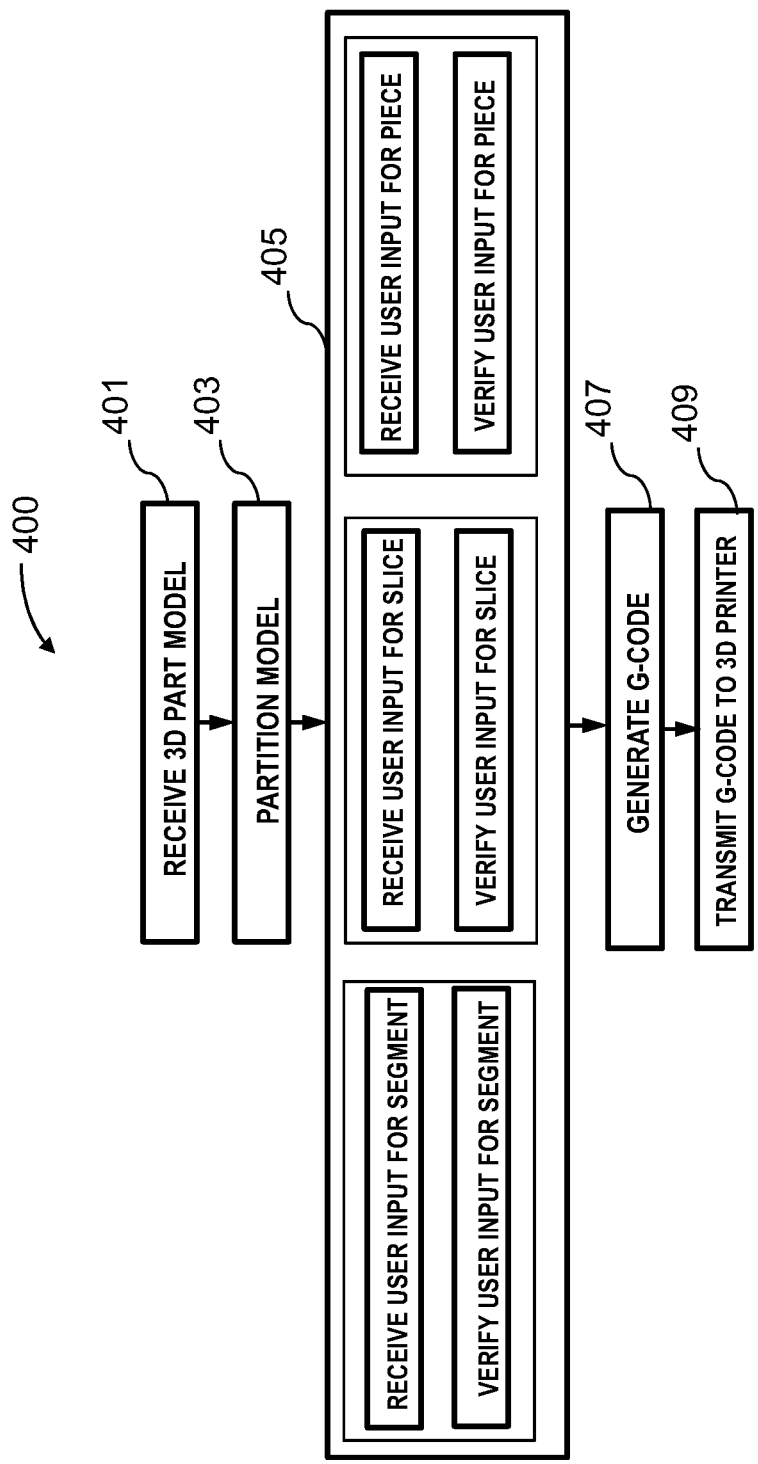
FIG. 4 illustrates an exemplary process of slicing a three-dimensional (3D) part model, in accordance with embodiments of the present disclosure.

FIG. 4 illustrates an exemplary process 400 of slicing a 3D part model, in accordance with embodiments of the present disclosure. A 3D part model may be processed by a slicer in a user interactive manner and produce numerical control programming codes for fabricating the part using a 3D printer.

The process may begin with receiving a 3D part model 401. The 3D part model may be a job file or a computer aided design (CAD) model as described elsewhere herein. The 3D part model may then be partitioned into a plurality of elements according to a hierarchy 403. The hierarchy may comprise a plurality of levels such as a segment-slice-piece-part-job hierarchy or segment-layer-job hierarchy. In some cases the smallest unit of the hierarchy may be a segment such that a user may specify one or more parameters for any segment of the part model. It should be noted that a 3D model can be partitioned in various ways so long as the user is allowed to specify one or more parameters for an arbitrary or predetermined region of the part model.

The 3D part model may be automatically partitioned without requiring user input. For instance upon receiving the 3D part model, according to a pre-determined hierarchy, the 3D part model may be partitioned and arranged accordingly. Alternatively, the 3D part model may be partitioned according to user input data. For example, a user may determine how a 3D part model may be partitioned such as by providing data indicating a specific hierarchy, number of elements for a level, geometrics of an element and the like.

Next, one or more parameters associated with the partitioned 3D model at different levels may be specified by a user 405. In the illustrated example, a user may modify or specify one or more parameters associated with a segment, a slice, a piece, a part or a job as described elsewhere herein. A user may input the parameters sequentially according to the hierarchical structure. For instance, a user may be prompted to input data for the parameters associated with a plurality of segments ordered within a slice first, then input data for the parameters associated with the slice and subsequent slices according to a pre-determined order, and then input data for the parameters associated with the part and other parts according to a pre-determined order. In other examples, a user may not need to finish inputting the parameters for all the segments in a slice in order to move on to the next slice. Additionally or alternatively, the user may select a random segment, slice, piece or part to specify the parameters at any point of the process and in any order. In some cases, a user may select any arbitrary or predetermined portion of a 3D part model, and the selected portion may be partitioned into a plurality of slices and segments.

In some cases, the user may only modify or provide data for a parameter of interest whereas the remaining parameters may be left with a default value. The default value may be set by the slicer based on a built-in rule. The default value may be set as a value received for the same parameter at the same level or at different levels. In some cases, when there is a conflict between parameters set for different levels, the slicer may automatically optimize the parameters according to the built-in rule or the recent parameter may override the previous value in conflict.

In some embodiments, upon receiving a user inputted value or data for a parameter, the parameter may be verified. A value of a parameter may be verified, for example, to be within a pre-set range or in compliant with a valid format. In some cases, if a user inputted value exceeds a pre-set range or invalid, a message may be generated and prompt the user to fix the value. For instance, when the user sets a speed exceeding a maximum limit, the user may receive a message indicating the error. Alternatively, when the input value is invalid, the value may be automatically adjusted to be within a valid range without generating a message.

The process may proceed to generating a numerical control programming code 407 once the user finishes inputting the parameters. During this operation, one or more parameters associated with the coding operation can be specified or modified by a user. A user may specify one or more parameters at different levels according to the hierarchy. For instance, a user may specify one or more parameters associated with a segment, a slice, a piece, a part or a job. The one or more parameters may be related to fabrication instructions specific to the printer configuration, coding, print head motion and various other factors as described elsewhere herein. As described above, a numerical control programming code may be generated for each segment in a slice then be combined to generate a code for the slice. In some cases, additional instructions may be provided for arranging the plurality of codes associated with the plurality of segments in an order. In some cases, the combined code may further include one or more parameters at the slice level to generate the code for the slice. Similarly, a plurality of numerical control programming codes associated with a plurality of slices may be combined to generate the code for a piece. The same operations may be applied to the numerical control programming codes for the piece and/or the part until the numerical control programming code for the 3D part model or the job is completed. Then the numerical control programming code file may be transmitted to a 3D printer for execution 409.

Although FIG. 4 shows a method in accordance with some embodiments a person of ordinary skill in the art will recognize that there are many adaptations for various embodiments. For example, the operations can be performed in any order. Some of the operations may be precluded, some of the operations may be performed concurrently in one step, some of the operations repeated, and some of the operations may comprise sub-steps of other operations. For instance, in some cases a G-code for a segment may be generated immediately after the parameters associated with the segment are confirmed. Alternatively, the G-code for the segment may not be generated until all of the parameters are confirmed for the slice, the piece, the part or the job. The method may also be modified in accordance with other aspects of the disclosure as provided herein.

Figure 5:
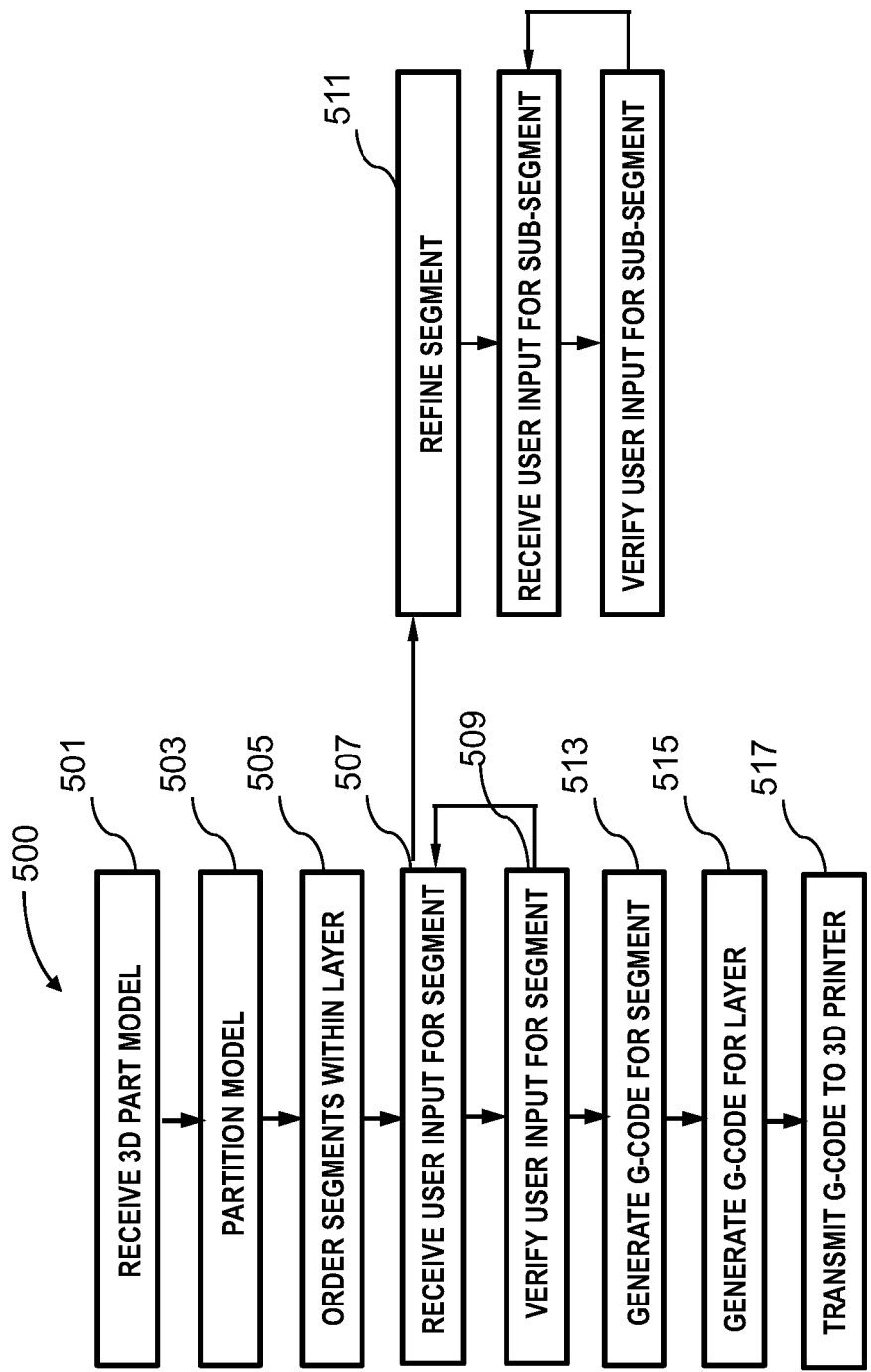
FIG. 5 shows another exemplary method performed by an interactive slicer, in accordance with embodiments of the present disclosure.

FIG. 5 shows another exemplary method 500 performed by an interactive slicer, in accordance with embodiments of the present disclosure. In some embodiments, a user may further refine a segment during the slicing process. One or more parameters can be modified or specified by a user at different levels and/or at different operations.

The process 500 may begin with receiving a 3D part model 501 and partitioning the model according to a hierarchy 503. These operations can be the same as the operations as described in FIG. 4. As mentioned above, the hierarchy may comprise multiple levels. In the illustrated example, the hierarchy may comprise partitioning a 3D part model into a plurality of layers and partitioning a layer into a plurality of segments. When the 3D part model comprises multiple parts, a layer may be a cross-section plane intersecting with multiple parts/pieces such that a single layer may comprise segments from different parts/pieces.

Once the 3D model is partitioned, the plurality of segments may be ordered 505 or arranged within a layer. The plurality of segments may be ordered automatically according to a pre-determined rule or ordered by a user according to user inputted instruction. Next, the user may be prompted to input values or data for interested parameters associated with each segment sequentially according to the order 507. Alternatively or additionally, the user may select a specific segment to modify one or more parameters at any point during the process.

In some embodiments, the user may further refine a segment 511. In this case, a segment may further be partitioned into a plurality of sub-segments. For example, when the user inputs parameter values for a given segment, the user may also be provided with an option whether to further refine the given segment. Once a given segment is refined per user's instruction, the user may modify one or more parameters associated with the sub-segments. The one or more parameters associated with the sub-segment can be similar to the parameters associated with the segment. In some cases, once the user inputted value is received, the value may be verified for validity in the same manner as described elsewhere herein. A user may select any segment for refinement. In some cases, a user may define the dimension or size of the sub-segment.

In some cases, user inputted value for the one or more parameters associated with a segment may be verified by the slicer 509. A user may or may not be prompted to adjust the input value when an error or invalid value is identified. In some cases, a user may change or specify one or more parameters for a layer (not shown). Once the user finishes inputting values for the parameters for the partitioned 3D model, one or more numerical control programming codes (e.g., G-code) may be produced for each segment 513. This operation can be the same as the code generating operation 407 as described in FIG. 4. A user may specify one or more parameters related to fabrication configuration, coding or print head motion associated with the segment at this operation. In some case, the plurality of G-codes associated with the plurality of slices within a layer may be combined to generate the G-code for the layer 515. A user may specify one or more parameters related to fabrication configuration, coding or print head motion associated with the layer at this operation. In some cases, additional instructions may be provided for arranging the plurality of codes associated with the plurality of segments in an order. In some cases, the combined code may further include one or more parameters at the layer level as described above. Similarly, a plurality of numerical control programming codes associated with a plurality of layers may be combined to generate the code for a job. The same operations may be applied to the numerical control programming codes for the layer until the numerical control programming code for the job is completed. Then the G-code file may be transmitted to a 3D printer for execution 517.

There are various alternatives or modifications to the method of FIG. 5. For example, the operations can be performed in any order. Some of the operations may be precluded, some of the operation may be performed concurrently in one operation, some of the operation repeated, and some of the operation may comprise sub-operations of other operations. For instance, in some cases a G-code for a segment may be generated immediately after the parameters associated with the segment are confirmed. Alternatively, the G-code for the segment may not be generated until all of the parameters are confirmed for the layer. The method may also be modified in accordance with other aspects of the disclosure as provided herein.

The method for slicing a part for printing may further comprise receiving user inputted data via a user interface and electronically outputting a result in response to the user inputted data (e.g., print head tool path) on the user interface. The result may be in any form such as text, numerical numbers, graphical elements, and the like. The result may comprise dynamically rendering the segment, slice, piece, or part with one or more properties specified by the inputted parameters. For example, once a user specifies a toolpath pattern for a given segment, the print head toolpath may be electronically applied to the corresponding segment outputted on a graphical user interface. In some cases, the result may comprise a message indicating an invalid input value or a successful input of a value.

Figure 6:
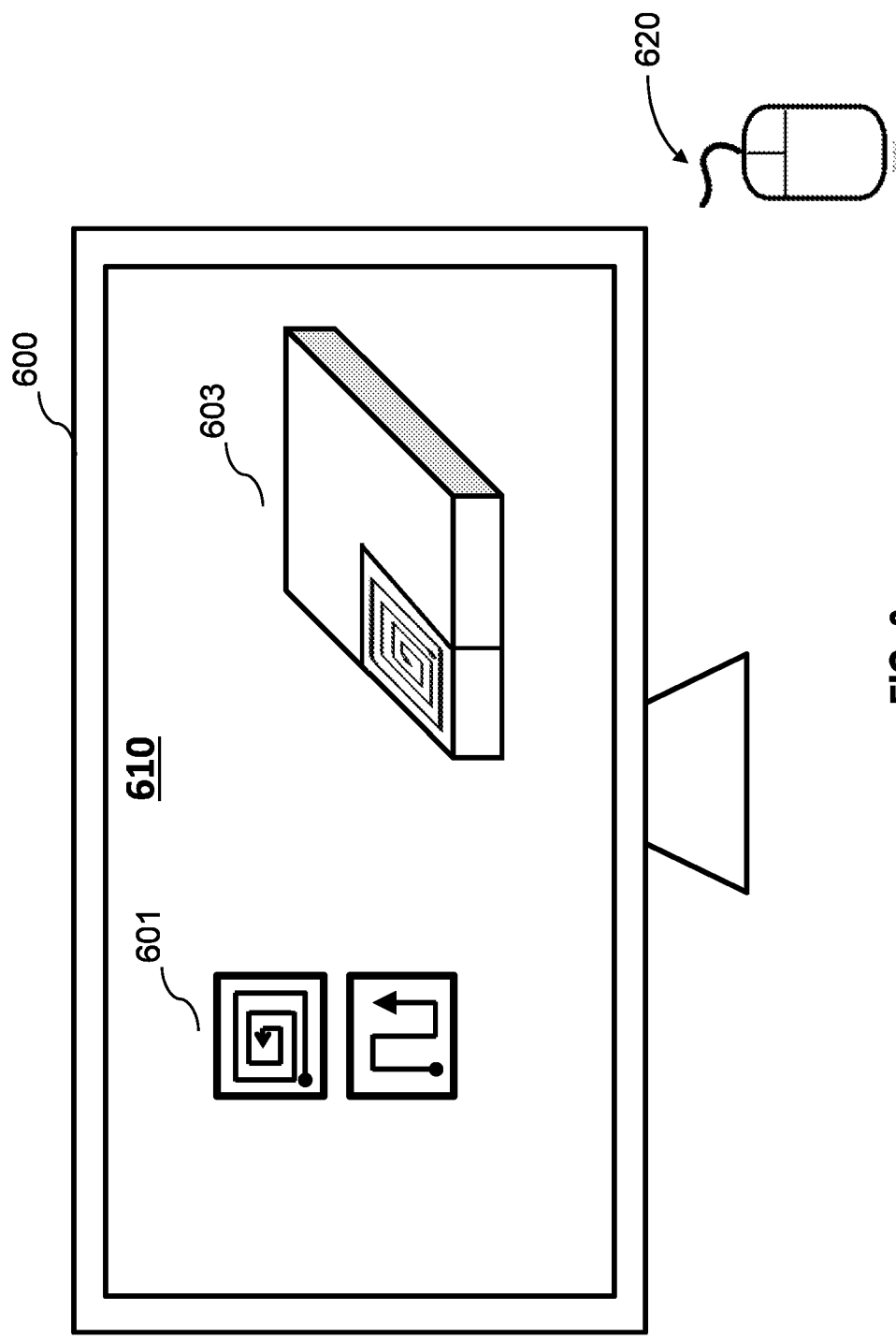
FIG. 6 shows an example of a user interface for an interactive slicing process.

FIG. 6 shows an example of a user interface 610 for an interactive slicing process. The user interface 610 may provide a variety of tools for slicing a 3D model in the interactive environment. The user interface 610 may be utilized in a local computing device 600 or any of networked environments including without limitation an online platform or a local area network.

The user interface 610 may provide, for example, a list of adjustable parameters 601 for a user and a dynamic result 603 in response to receiving a user inputted parameter. Any suitable form may be used to display the list of adjustable parameters, such as drop-down list, tables, slider bars, charts, pictorial representations, direct input and the like. In some cases, a graphic representation of the current model with the property annotated or illustrated may be displayed to the user. The user may select one or more parameters for adjustment.

In some cases, a graphic representation of partitioned model may be displayed on the user interface. A plurality of elements indicating the partitioning result may be shown with respect to the 3D model such that a user may visualize the segments, slices, pieces and the like. In an example, the user may first select an element from a specific level (e.g., segment, slice, piece, part, etc.) then select the parameters. For instance, a user may select a segment or a piece from the graphic representation of the model then input parameters associated with the selected elements. In another example, the user may select any arbitrary ore predetermined region from the graphical representation for inputting parameters. The region can comprise any number of segments, slices, or pieces. The region can have any shape, volume or dimension.

In some cases, in response to a user input, the user interface 610 may translate the user input and display a graphic representation of the model as a result. As shown in the illustrated example, upon receiving user inputted data indicating a trace pattern and/or trace geometrics for a given slice, the slice with the specified trace 613 may be displayed on the user interface. In some cases, a toolpath for a selected portion of the model can be shown to a user within the user interface.

In some cases, the user interface 610 may provide an error checking tool as contemplated above. The error checking tool may verify a user inputted parameter for validity. In some cases, a user may be informed of an invalid input value on the user interface. In some cases, an invalid input data (e.g., invalid format) may be automatically fixed by the error checking tool according to an inherent rule.

In some cases, the user interface 610 may incorporate a design environment, such as a web-based CAD platform or the like that users can employ to modify designs and submit designs or components of a design to printing resources. This may facilitate drag-and-drop fabrication of a complete, multi-part CAD design. A user may also or instead be able to select portions of an assembly and print only those portions. In some cases, the user interface may provide tools for model design, print previews, file repairs, topology optimization, size optimization (e.g., to fit the models in a build volume), hollowing, compensation for build flaws (e.g., shrinking, curling, and so on), surface texturing, optimized grouping, material selection, nesting, coloring, smoothing, contouring, multi-platform support, mesh repair, and so forth.

In some cases, the user interface 610 may provide a photorealistic rendering mode that shows how the model will look when printed. The rendering may include support structures such as rafts and the like, as well as other features such as striations, surface textures and finish, and the like, or the rendering may omit some or all of these ancillary structures. The renderings may show surface finishes such as matte surfaces versus glossy surfaces. The rendering may be created using information pertaining to light sources (e.g., virtual lighting of the rendered model), layer heights, toolpaths, orientations, tessellations, colors, and so on. In some cases, a toolpath for a model can be shown to a user within the user interface.

In some embodiments, users may input parameters or select a specific partitioned element via a user interactive device 620. Examples of such user interactive devices may include a keyboard, button, mouse, touchscreen, touchpad, joystick, trackball, camera, microphone, motion sensor, heat sensor, inertial sensor, or any other type of user interactive device.

Figure 7:
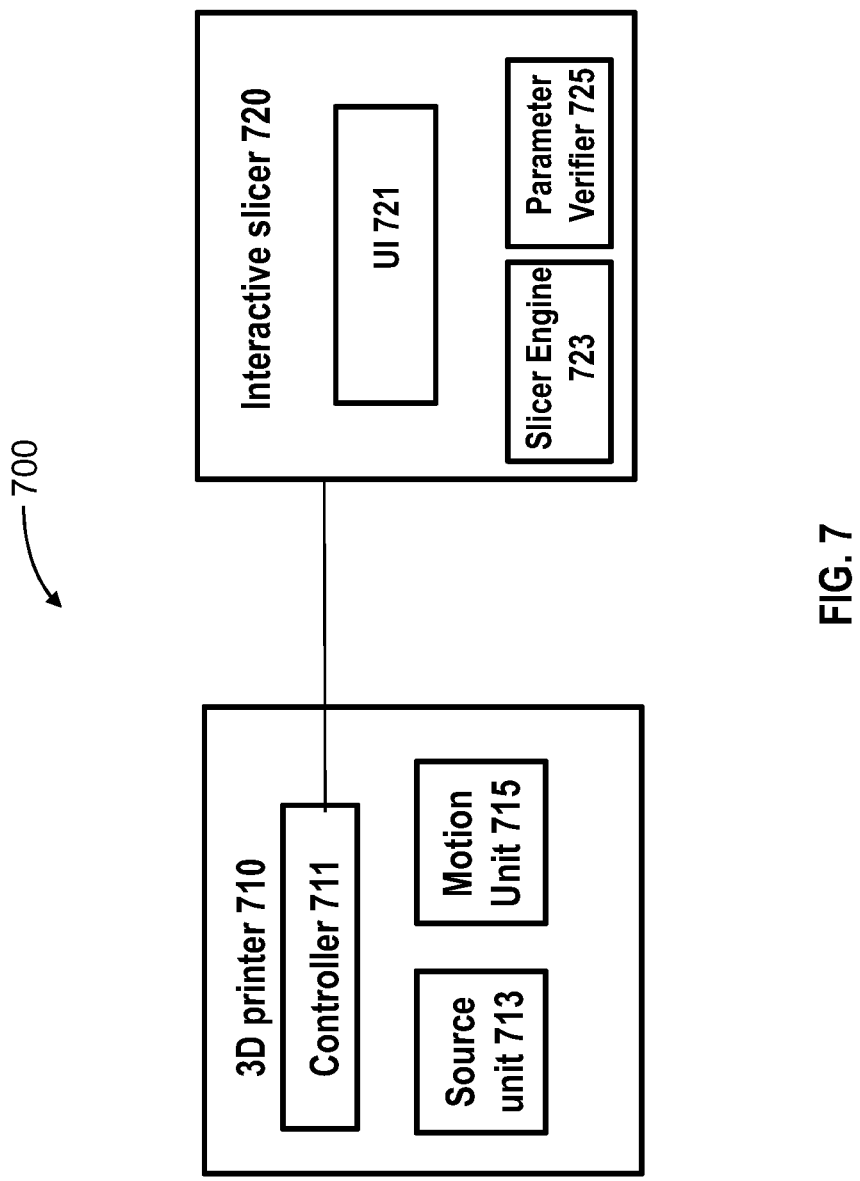
FIG. 7 illustrates a system, which may be used to interactively slice a part.

FIG. 7 illustrates a system 700, which may be used to interactively slice a part. The system 700 may comprise a 3D printer 710 and an interactive slicer 720. The interactive slicer 720 may be a standalone system. Alternatively, the interactive slicer 720 may be a component of the 3D printer 710.

The interactive slicer 720 may comprise a user interface 721, a slicer engine 723 and a parameter verifier 725. The user interface can be the same as the user interface as described in FIG. 6. The slicer engine 723 may be configured to partition a 3D model or a job into a plurality of elements (e.g., segment, slice, layer, piece, part, etc.) according to a hierarchy. The plurality of elements may be arranged in different levels as described elsewhere herein. The slicer engine may further be configured to provide one or more adjustable parameters associated with the plurality of elements to a user for adjustment. The parameter verifier 725 may be configured to check the validity of the one or more parameters as described elsewhere herein.

The slicer engine 723 and the parameter verifier 725 can be implemented in hardware components, software component or combinations of hardware and software. For example, the slicer engine and/or the parameter verifier can be implemented by one or more processors that can be a single or multiple microprocessors, field programmable gate arrays (FPGAs), ASICs, special purpose computers, general purpose unit, graphic processing unit (GPU) or digital signal processors (DSPs) capable of executing particular sets of instructions. Computer-readable instructions can be stored on a tangible non-transitory computer-readable medium, such as a flexible disk, a hard disk, a CD-ROM (compact disk-read only memory), and MO (magneto-optical), a DVD-ROM (digital versatile disk-read only memory), a DVD RAM (digital versatile disk-random access memory), or a semiconductor memory.

The interactive slicer 720 may be in communication with the 3D printer 710. The communication may be two-way communication. For example, the interactive slicer 720 may transmit the numerical control programming code (e.g. G-Code) to the 3D printer. In another example, the interactive slicer may retrieve the printer specific information such as printer settings, resources, specifications from the 3D printer for determining one or more of the parameters or a valid range of the value of the parameters.

The 3D printer 710 can be any type of 3D printer as described elsewhere herein. The 3D printer may comprise a controller 711 for controlling a plurality of parameters provided by the G-code. The controller may be configured to provide instructions or signals to the motion unit 712 and the source unit 713 for controlling print head movement driven by the motion unit 715, and one or more fabrication configurations such as voltage, current, feedstock feed rate and various others actuated by the source unit 713. The interactive slicer may be a standalone system separate from the controller 711. In alternative embodiments, the interactive slicer may be part of the controller 711.

The present disclosure provides computer systems that may be programmed or otherwise configured to implement devices, methods and systems of the present disclosure. The processor may be a hardware processor such as a central processing unit (CPU), a graphic processing unit (GPU), or a general-purpose processing unit. The processor can be any suitable integrated circuits, such as computing platforms or microprocessors, logic devices and the like. Although the disclosure is described with reference to a processor, other types of integrated circuits and logic devices are also applicable. The processors or machines may not be limited by the data operation capabilities. The processors or machines may perform 512 bit, 256 bit, 128 bit, 64 bit, 32 bit, or 16 bit data operations.

Figure 8:
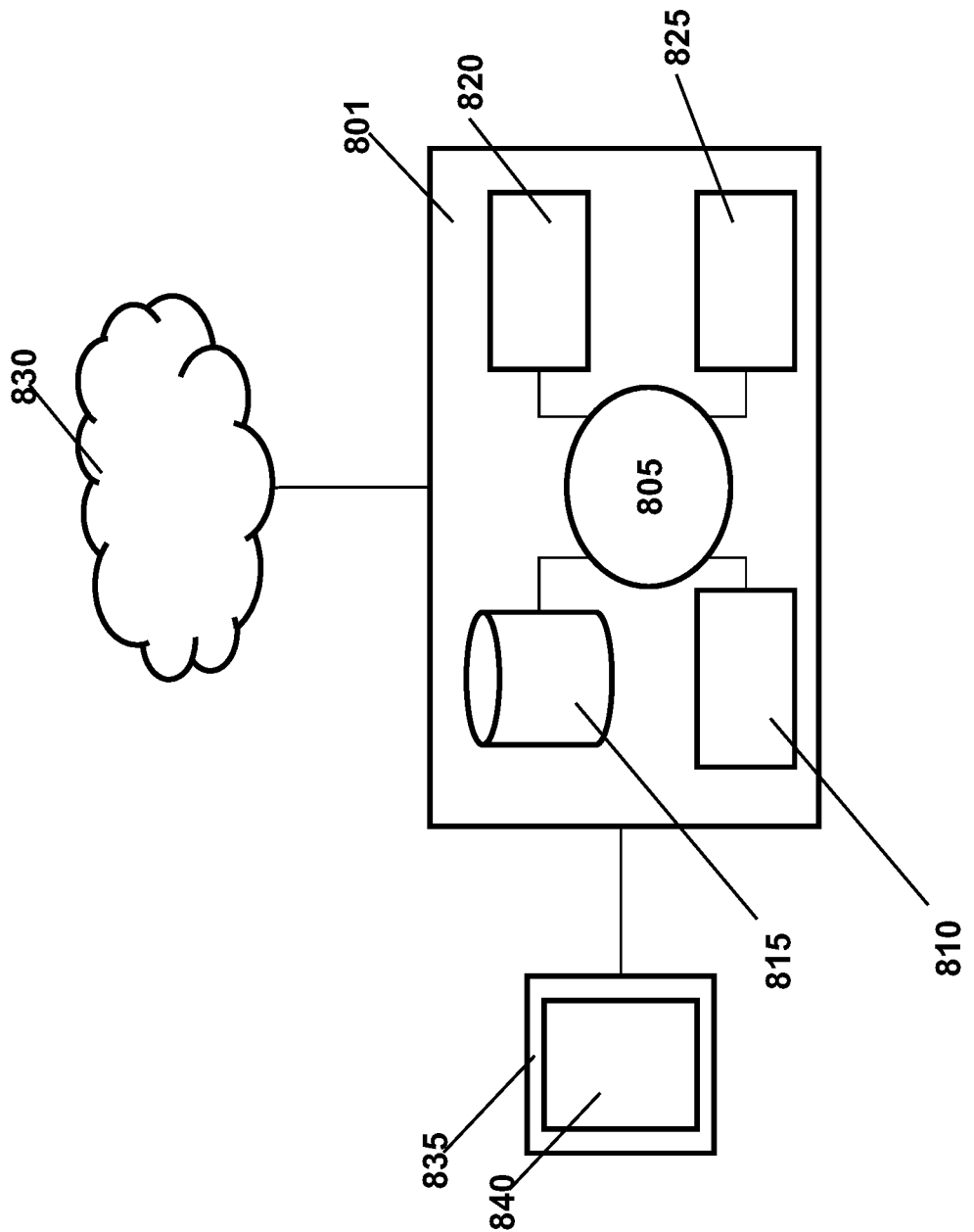
FIG. 8 shows a computer system that can be configured to implement any computing system disclosed in the present application.

In some embodiments, the processor may be a processing unit of a computer system. FIG. 8 shows a computer system 801 that can be configured to implement any computing system disclosed in the present application. The computer system 801 can comprise a mobile phone, a tablet, a wearable device, a laptop computer, a desktop computer, a central server, etc.

The computer system 801 includes a central processing unit (CPU, also "processor" and "computer processor" herein) 805, which can be a single core or multi core processor, or a plurality of processors for parallel processing. The CPU can be the processor as described above. The computer system 801 also includes memory or memory location 810 (e.g., random-access memory, read-only memory, flash memory), electronic storage unit 815 (e.g., hard disk), communication interface 820 (e.g., network adapter) for communicating with one or more other systems, and peripheral devices 825, such as cache, other memory, data storage and/or electronic display adapters. In some cases, the communication interface may allow the computer to be in communication with another device such as the imaging device or audio device. The computer may be able to receive input data from the coupled devices for analysis. The memory 810, storage unit 815, interface 820 and peripheral devices 825 are in communication with the CPU 805 through a communication bus (solid lines), such as a motherboard. The storage unit 815 can be a data storage unit (or data repository) for storing data. The computer system 801 can be operatively coupled to a computer network ("network") 830 with the aid of the communication interface 820. The network 830 can be the Internet, an internet and/or extranet, or an intranet and/or extranet that is in communication with the Internet. The network 830 in some cases is a telecommunication and/or data network. The network 830 can include one or more computer servers, which can enable distributed computing, such as cloud computing. The network 830, in some cases with the aid of the computer system 801, can implement a peer-to-peer network, which may enable devices coupled to the computer system 801 to behave as a client or a server.

The CPU 805 can execute a sequence of machine-readable instructions, which can be embodied in a program or software. The instructions may be stored in a memory location, such as the memory 810. The instructions can be directed to the CPU 805, which can subsequently program or otherwise configure the CPU 805 to implement methods of the present disclosure. Examples of operations performed by the CPU 805 can include fetch, decode, execute, and writeback.

Methods and systems of the present disclosure can be implemented by way of one or more algorithms. An algorithm can be implemented by way of software upon execution by the central processing unit 805. The algorithm can, for example, partition a computer model of a part according to a hierarchy, receive user inputted data for modifying one or more parameters and produce a machine code.

The CPU 805 can be part of a circuit, such as an integrated circuit. One or more other components of the system 801 can be included in the circuit. In some cases, the circuit is an application specific integrated circuit (ASIC).

The storage unit 815 can store files, such as drivers, libraries and saved programs. The storage unit 815 can store user data, e.g., user preferences and user programs. The computer system 801 in some cases can include one or more additional data storage units that are external to the computer system 801, such as located on a remote server that is in communication with the computer system 801 through an intranet or the Internet.

The memory 810 can be a volatile or non-volatile, magnetic, semiconductor, tape, optical, removable, non-removable, or other type of storage device or tangible and/or non-transitory computer-readable medium that stores programs, such as the interactive slicer and operating system. Common forms of non-transitory media include, for example, a flash drive, a flexible disk, a hard disk, a solid state drive, magnetic tape or other magnetic data storage medium, a CD-ROM or other optical data storage medium, any physical medium with patterns of holes, a RAM, a PROM, and EPROM, a FLASH-EPROM or other flash memory, NVRAM, a cache, a register or other memory chip or cartridge, and networked versions of the same.

The memory 810 may store instructions that enable processor to execute one or more applications, such as the interactive slicer and operating system, and any other type of application or software available or executable on computer systems. Alternatively or additionally, the instructions, application programs, etc. can be stored in an internal and/or external database (e.g., a cloud storage system—not shown) that is in direct communication with computing device, such as one or more databases or memories accessible via one or more networks (not shown). The memory 810 can include one or more memory devices that store data and instructions usable to perform one or more features provided herein. The memory 810 can also include any combination of one or more databases controlled by memory controller devices (e.g., servers, etc.) or software, such as document management systems, Microsoft SQL databases, SharePoint databases, Oracle™ databases, Sybase™ databases, or other relational databases. Data used in the slicing process such as hierarchies, rules for portioning a model corresponding to each hierarchy, valid range for some or all of the parameters, printer configurations, printer specifications, and the like may be stored in the one or more databases.

The computer system 801 may be communicatively connected to one or more remote memory devices (e.g., remote databases—not shown) through a network. The remote memory devices can be configured to store information that computer system 801 can access and/or manage. By way of example, the remote memory devices may be document management systems, Microsoft SQL database, SharePoint databases, Oracle™ databases, Sybase™ databases, Cassandra, HBase, or other relational or non-relational databases or regular files. Systems and methods provided herein, however, are not limited to separate databases or even to the use of a database.

The computer system 801 can communicate with one or more remote computer systems through the network 830. For instance, the computer system 801 can communicate with a remote computer system of a user. Examples of remote computer systems include personal computers, slate or tablet PC's, smart phones, personal digital assistants, and so on. The user can access the computer system 801 via the network 830.

Methods as described herein can be implemented by way of machine (e.g., computer processor) executable code stored on an electronic storage location of the computer system 801, such as, for example, on the memory 810 or electronic storage unit 815. The machine executable or machine readable code can be provided in the form of software. During use, the code can be executed by the processor 805. In some cases, the code can be retrieved from the storage unit 815 and stored on the memory 810 for ready access by the processor 805. In some situations, the electronic storage unit 815 can be precluded, and machine-executable instructions are stored on memory 810.

The code can be pre-compiled and configured for use with a machine having a processor adapted to execute the code, or can be compiled during runtime. The code can be supplied in a programming language that can be selected to enable the code to execute in a pre-compiled or as-compiled fashion.

Aspects of the systems and methods provided herein, such as the computer system 801, can be embodied in programming. Various aspects of the technology may be thought of as "products" or "articles of manufacture" typically in the form of machine (or processor) executable code and/or associated data that is carried on or embodied in a type of machine readable medium. Machine-executable code can be stored on an electronic storage unit, such as memory (e.g., read-only memory, random-access memory, flash memory) or a hard disk. "Storage" type media can include any or all of the tangible memory of the computers, processors or the like, or associated modules thereof, such as various semiconductor memories, tape drives, disk drives and the like, which may provide non-transitory storage at any time for the software programming. All or portions of the software may at times be communicated through the Internet or various other telecommunication networks. Such communications, for example, may enable loading of the software from one computer or processor into another, for example, from a management server or host computer into the computer platform of an application server. Thus, another type of media that may bear the software elements includes optical, electrical and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to non-transitory, tangible "storage" media, terms such as computer or machine "readable medium" refer to any medium that participates in providing instructions to a processor for execution.

Hence, a machine readable medium, such as computer-executable code, may take many forms, including but not limited to, a tangible storage medium, a carrier wave medium or physical transmission medium. Non-volatile storage media include, for example, optical or magnetic disks, such as any of the storage devices in any computer(s) or the like, such as may be used to implement the databases, etc. shown in the drawings. Volatile storage media include dynamic memory, such as main memory of such a computer platform. Tangible transmission media include coaxial cables; copper wire and fiber optics, including the wires that comprise a bus within a computer system. Carrier-wave transmission media may take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a ROM, a PROM and EPROM, a FLASH-EPROM, any other memory chip or cartridge, a carrier wave transporting data or instructions, cables or links transporting such a carrier wave, or any other medium from which a computer may read programming code and/or data. Many of these forms of computer readable media may be involved in carrying one or more sequences of one or more instructions to a processor for execution.

The computer system 801 can include or be in communication with an electronic display 835 that comprises a user interface 840 for providing, for example, a scanning interface or a footwear purchase interface. Examples of UI's include, without limitation, a graphical user interface (GUI) and web-based user interface. The user interface 840 may be the same as the user interface as described in FIG. 6. Alternatively, the user interface may be a separate user interface.

Methods and systems of the present disclosure can be implemented by way of one or more algorithms. An algorithm can be implemented by way of software upon execution by the central processing unit 805.

EXAMPLE

Figure 9A:
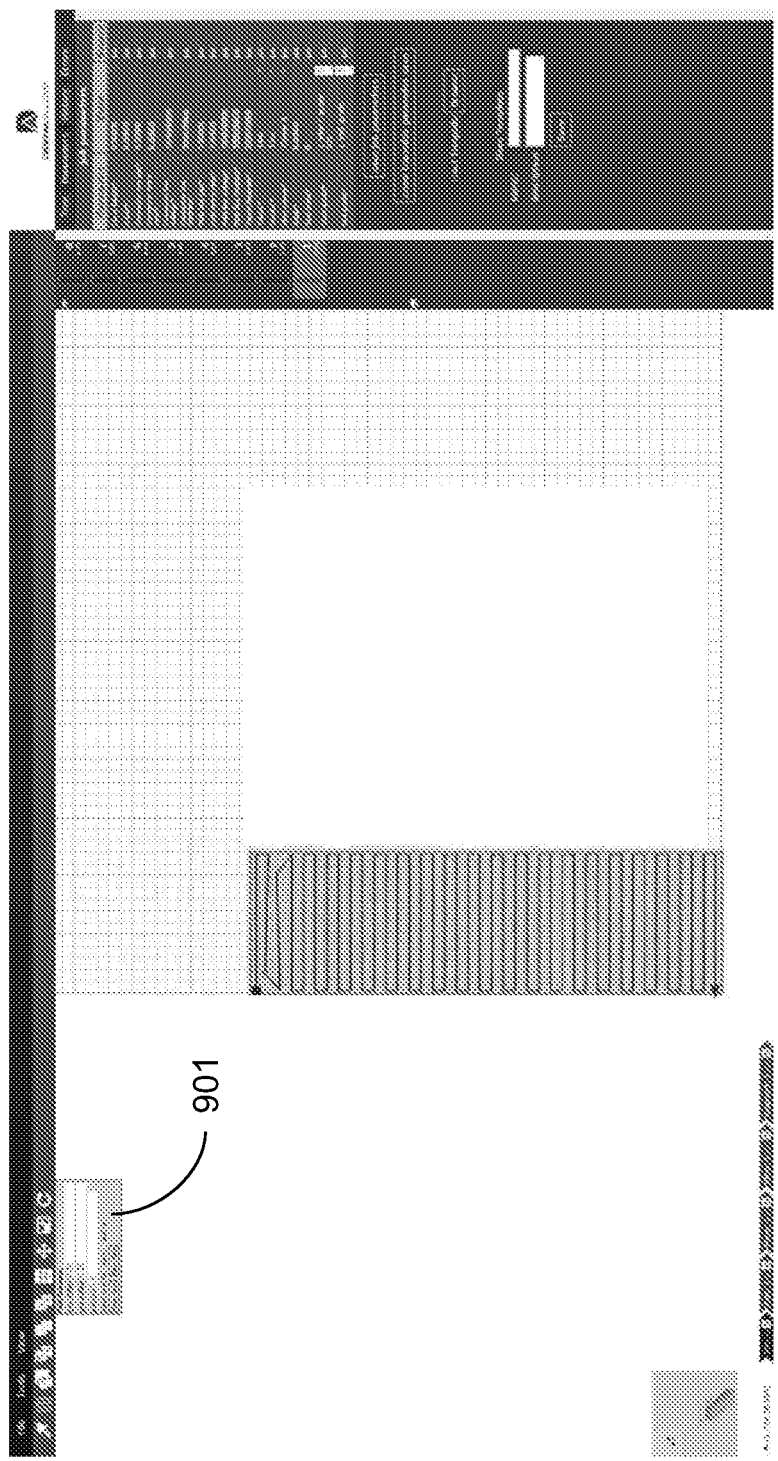
FIGS. 9A-9B show examples of graphical user interfaces showing print head tool paths generated in slices or segments corresponding to a 3D object for printing.
Figure 9B:
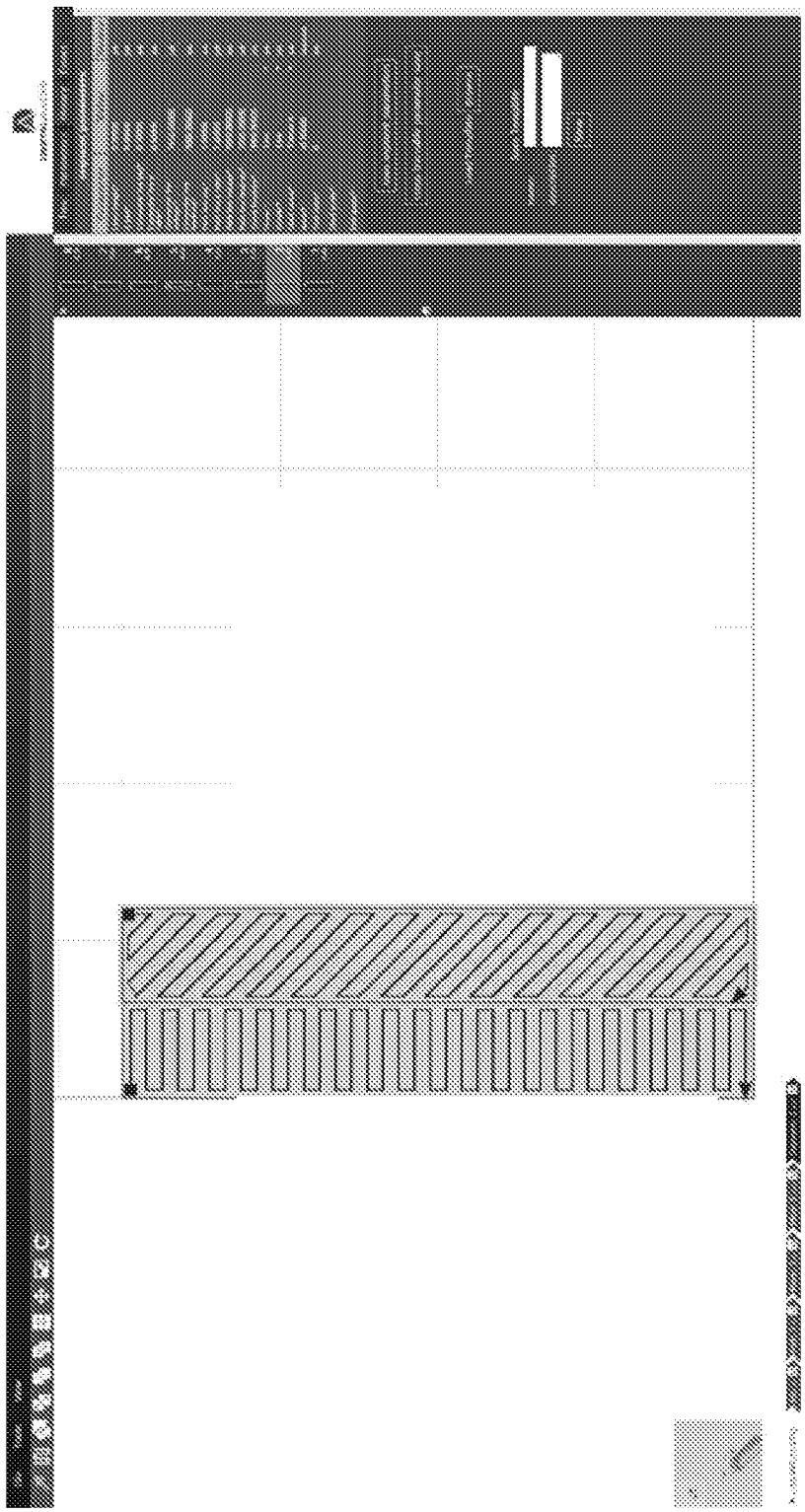
Figure 10:
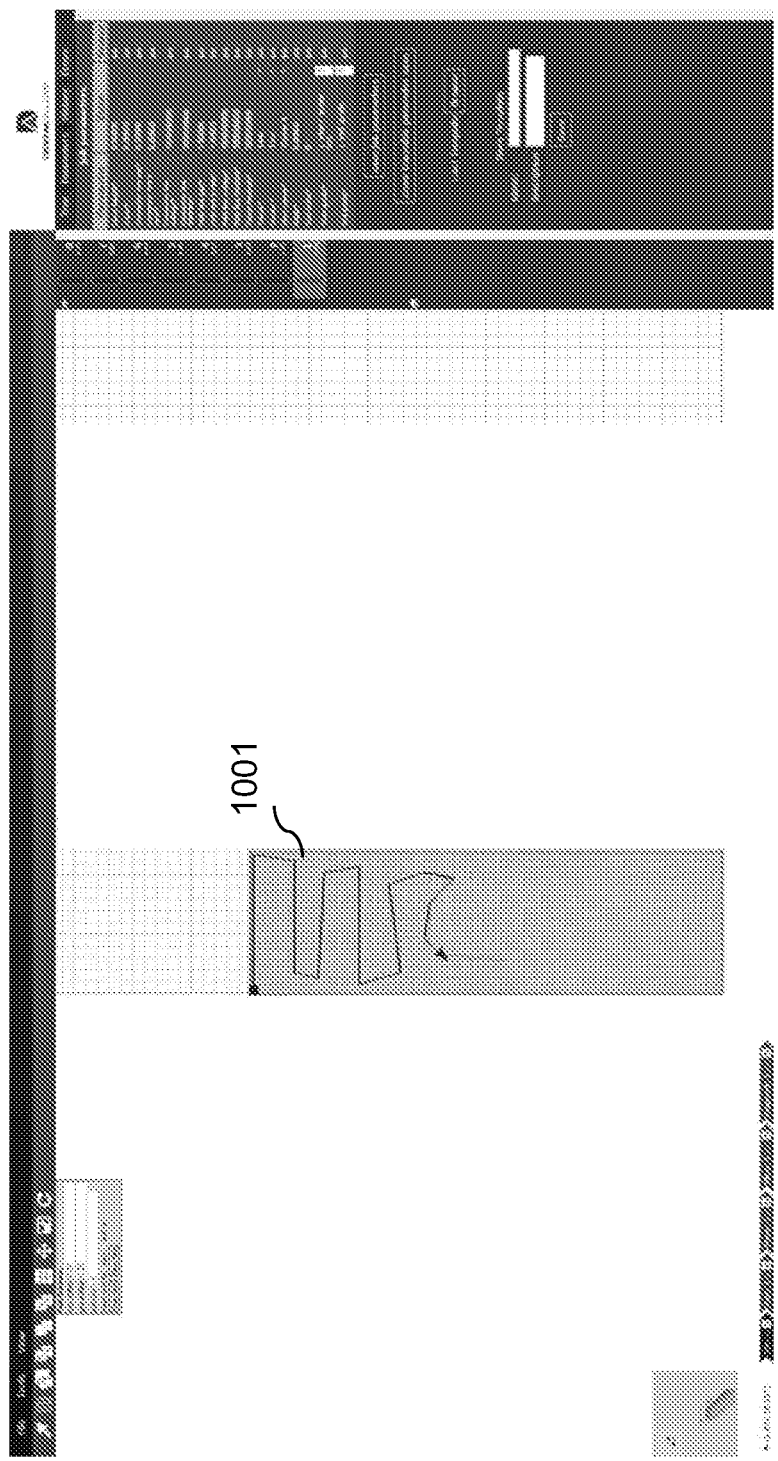
FIG. 10 shows an example of a graphical user interface (GUI) showing a print head tool path generated in slices or segments corresponding to a 3D object for printing.

FIGS. 9A-9B and FIG. 10 illustrate examples of graphical user interfaces (GUIs) for showing and editing print head tool paths generated in slices or segments corresponding to a 3D object for printing. Such tool paths may be manually generated, such as upon input by a user. Alternatively or additionally, the tool paths may be automatically generated then modified by a user manually. As shown in a top-down view of tool paths or trace in FIG. 9A, the print head tool path may be modified by a user via manually drag-and-drop a vertex of a polygonal shape, an edge or any portion of the tool path. In the illustrated example, a user may also generate a print head tool path by inputting one or more parameters 901 defining the trace pattern. In an example as shown in FIG. 9B, a user may input parameters such as angle of a trace pattern and the trace pattern of each segment can be modified individually. Alternatively or additionally, a user may generate a print head tool path or trace pattern by drawing the trace directly in a location selected by the user, as shown in FIG. 10. A trace pattern 1001 defined (e.g., manual drawing or parameters) by a user may be stored in a library and later applied to other regions and locations with or without transformation.

Figure 11:
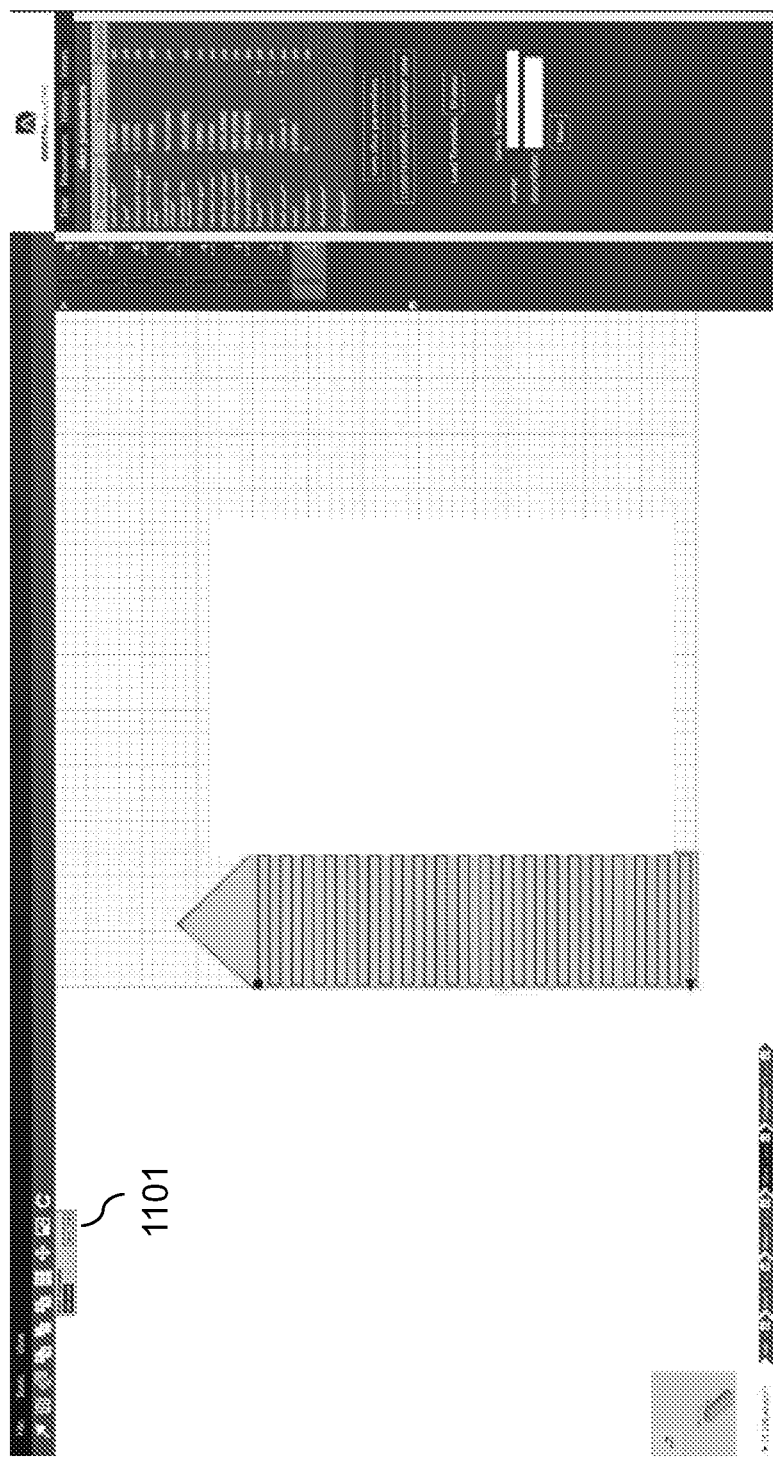
FIG. 11 shows an example of a GUI for allowing a user to modify the shape of a slice or segments.

FIG. 11 shows an example of a graphical user interface (GUI) that allows a user to modify the shape of a slice or segments. The shape of the slice may also relate to the shape of the shell. As shown in this example, a user may define, generate or modify the shape, dimension and/or geometry of the shell/slice or shape of a segment by inputting parameters in the text boxes 1101 or by manually drag-and-drop the boundary of the slice or the segment.

Figure 12A:
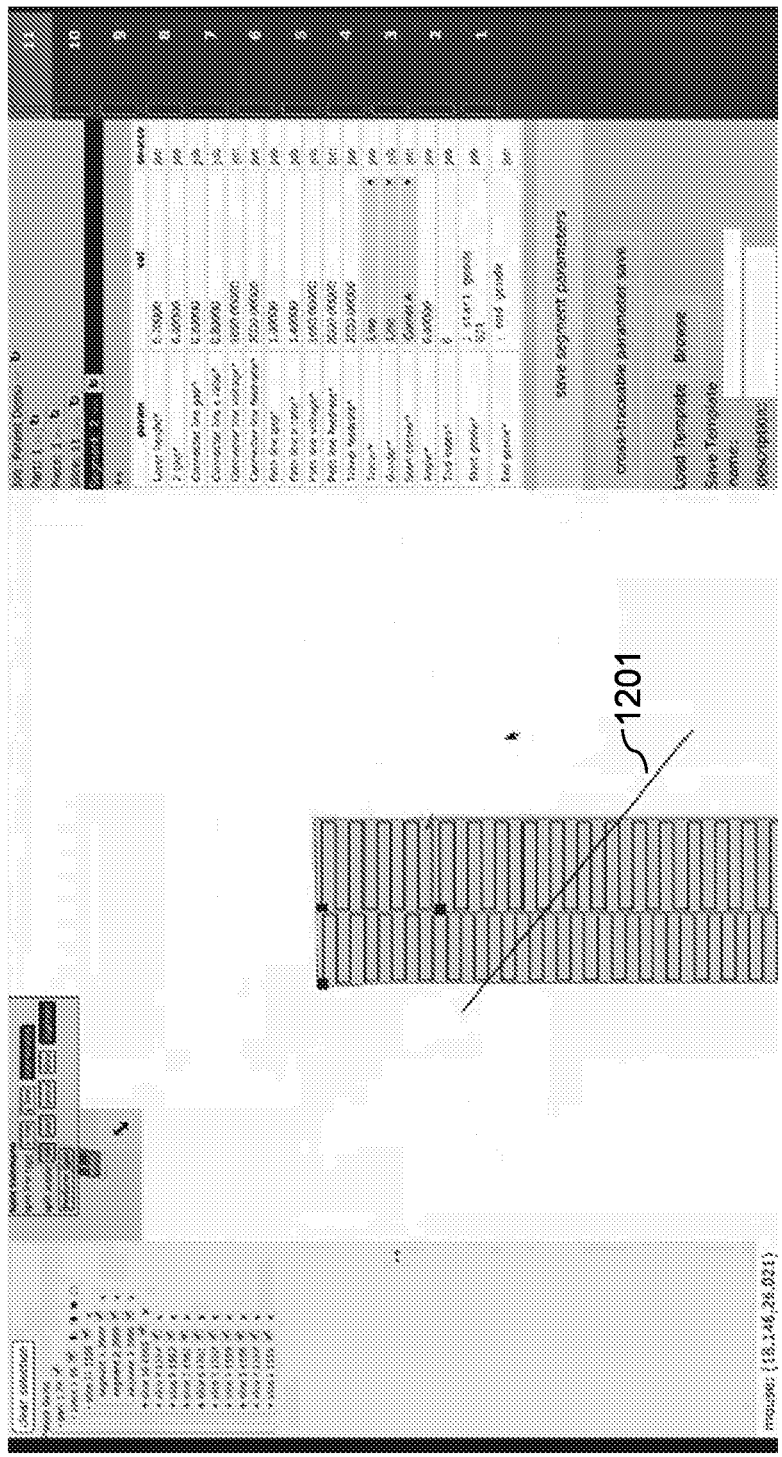
FIGS. 12A-12B show an example of a GUI for partitioning a slice into multiple segments.
Figure 12B:
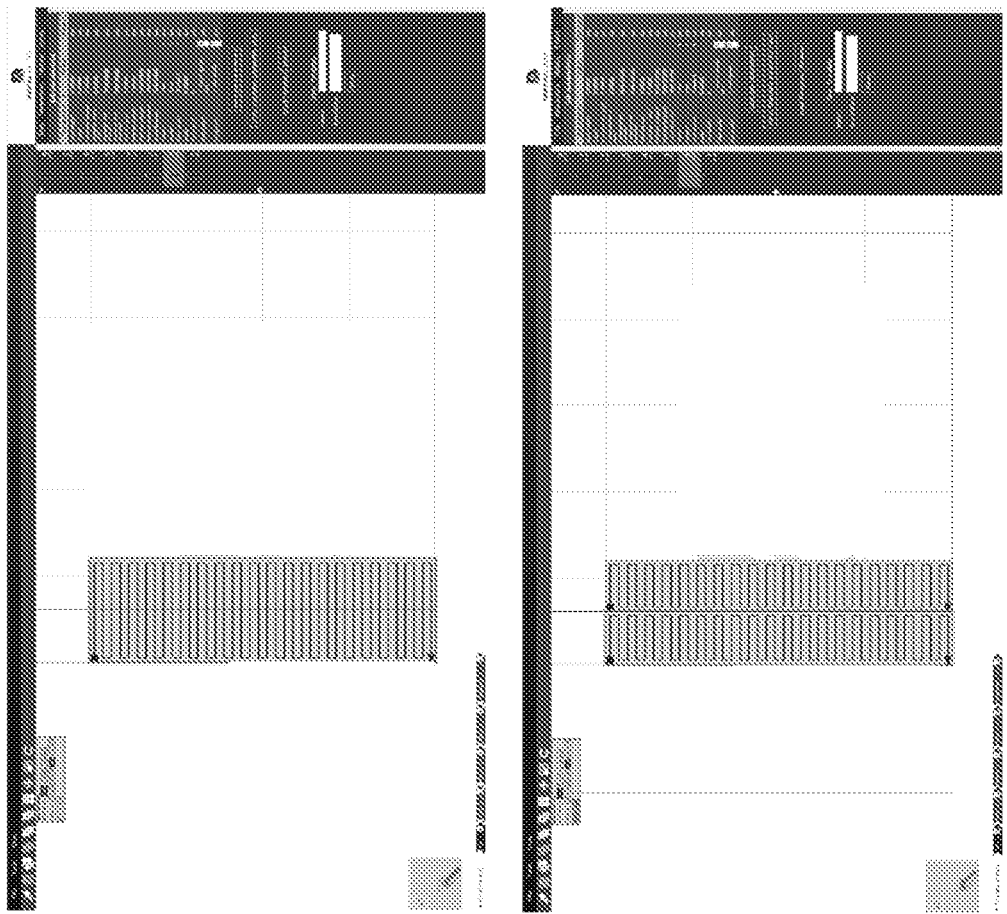

FIG. 12A shows an example of a GUI that permits a user to partition a slice into multiple segments. A slice may be partitioned or split into multiple segments by one or more split lines or boundaries 1201. As shown in the example, a user may input parameters defining the split lines via the text boxes. For instance, a user may define split lines by providing parameters such as coordinates, line shape and the like. Alternatively or additionally, a user may manually draw a split line as shown in the example. It should be noted that the segments can also be generated automatically based on pre-determined model or rules. FIG. 12B shows an example of a slice split into two segments and each segment is filled with a separate trace pattern.

Figure 13:
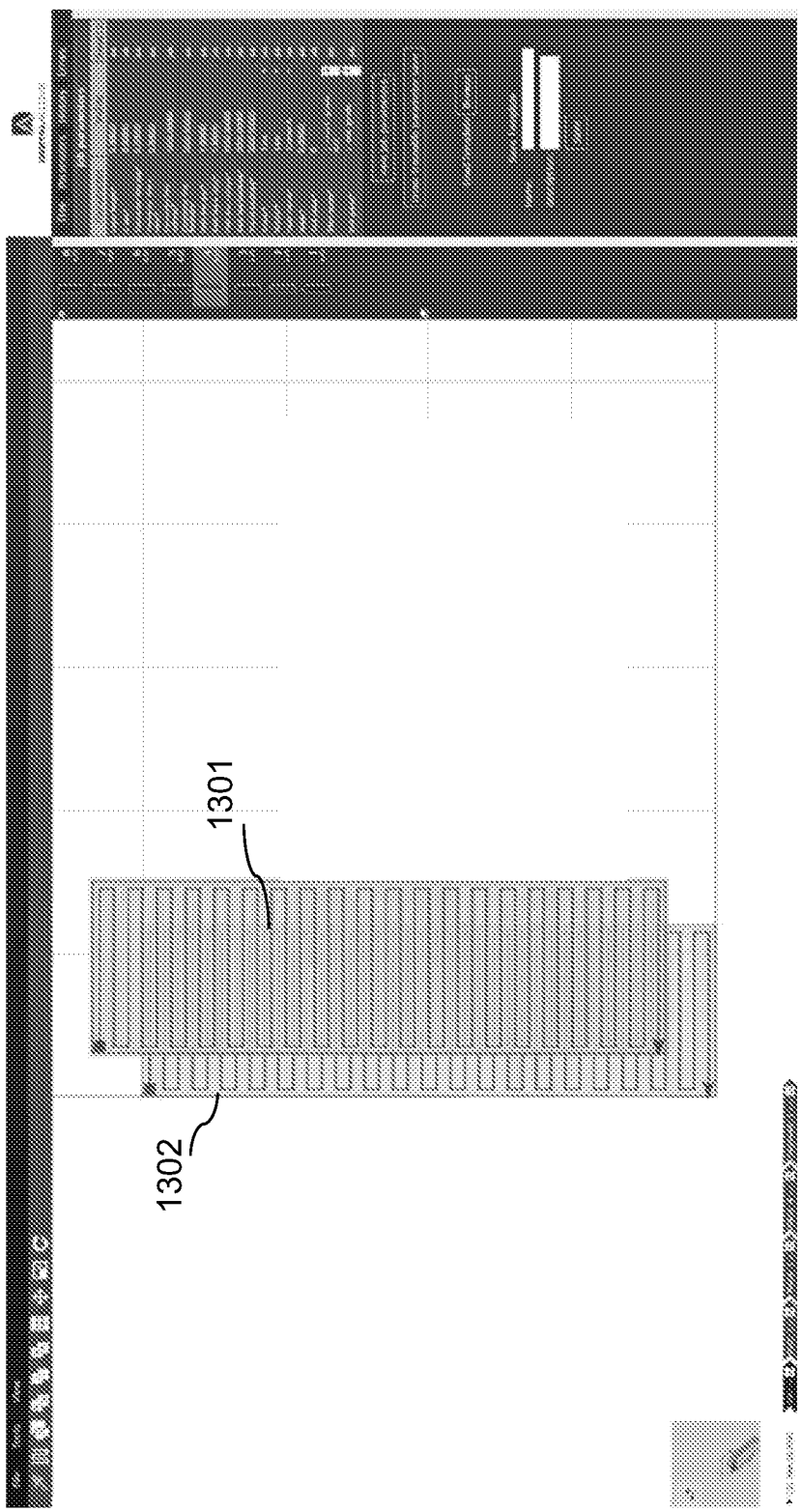
FIG. 13 shows an example of a GUI for displaying two slices or segments in a stack.

A user may view multiple slices or segments, which may advantageously allow a user to compare pattern of the current slice to a neighboring layer (e.g., a neighboring slice or segment a layer above or beneath). FIG. 13 shows an example of a GUI that displays two slices or segments 1301 and 1302 in a stack. The two slices or segments may or may not be next to each other. In some cases, a user may be allowed to view any multiple slices or segments in a stack. In some cases, a shift of trace or tool path in neighboring slices or segments may be desirable in order to reach a uniform and even finishing surface of the printed object. Therefore this function provides benefits for a user to easily visualize the relative location of trace or tool path of neighboring slices or segments.

Figure 14:
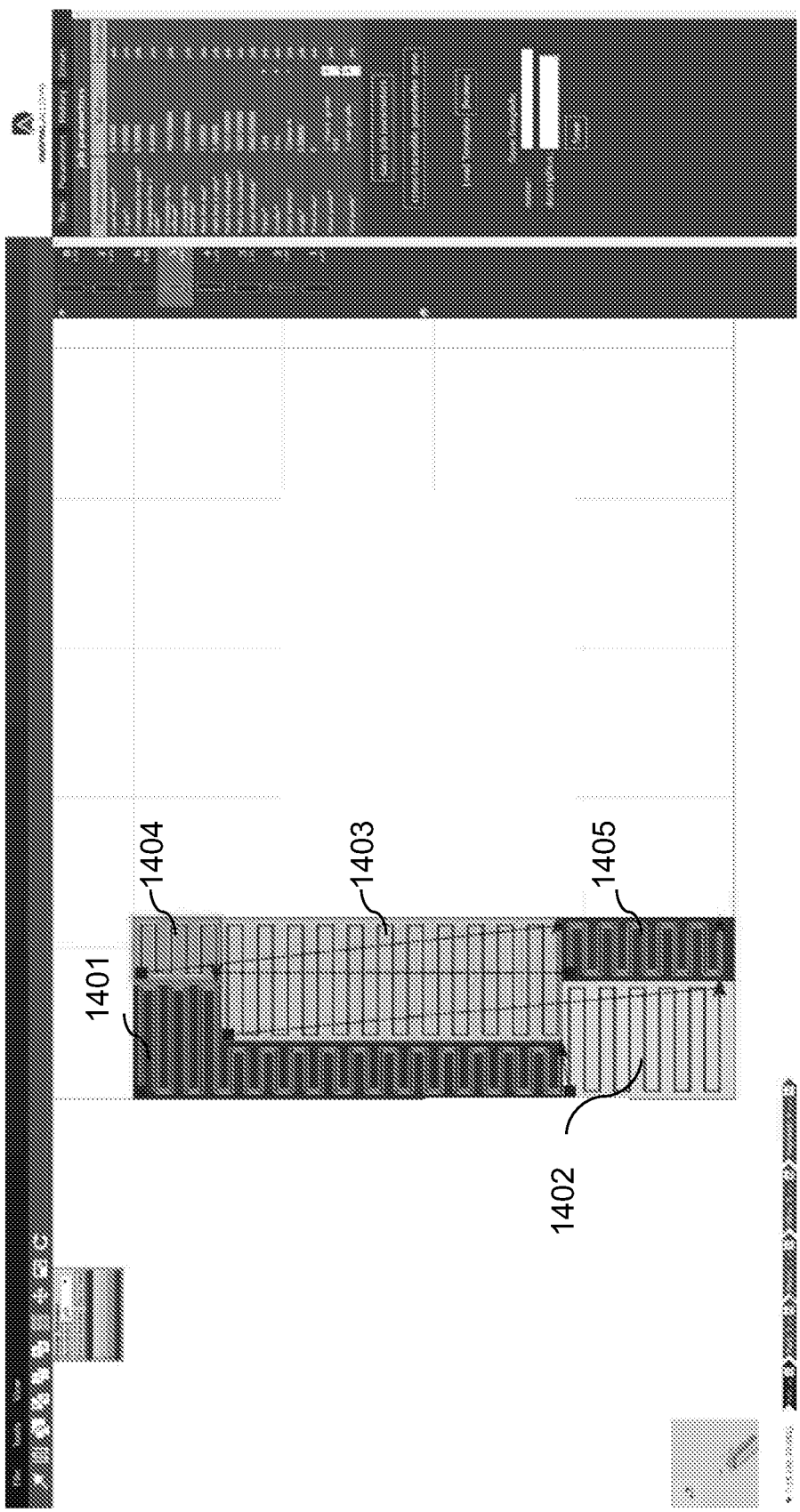
FIG. 14 shows an example of a GUI for defining order of segments within a slice.

FIG. 14 shows an example of a GUI that defines an order of segments within a slice. In this example, the order of the segments may be color coded (e.g., 1401, 1402, 1403, 1404, 1405) such that a user may conveniently visualize the order of the segments to be printed.

Figure 15:
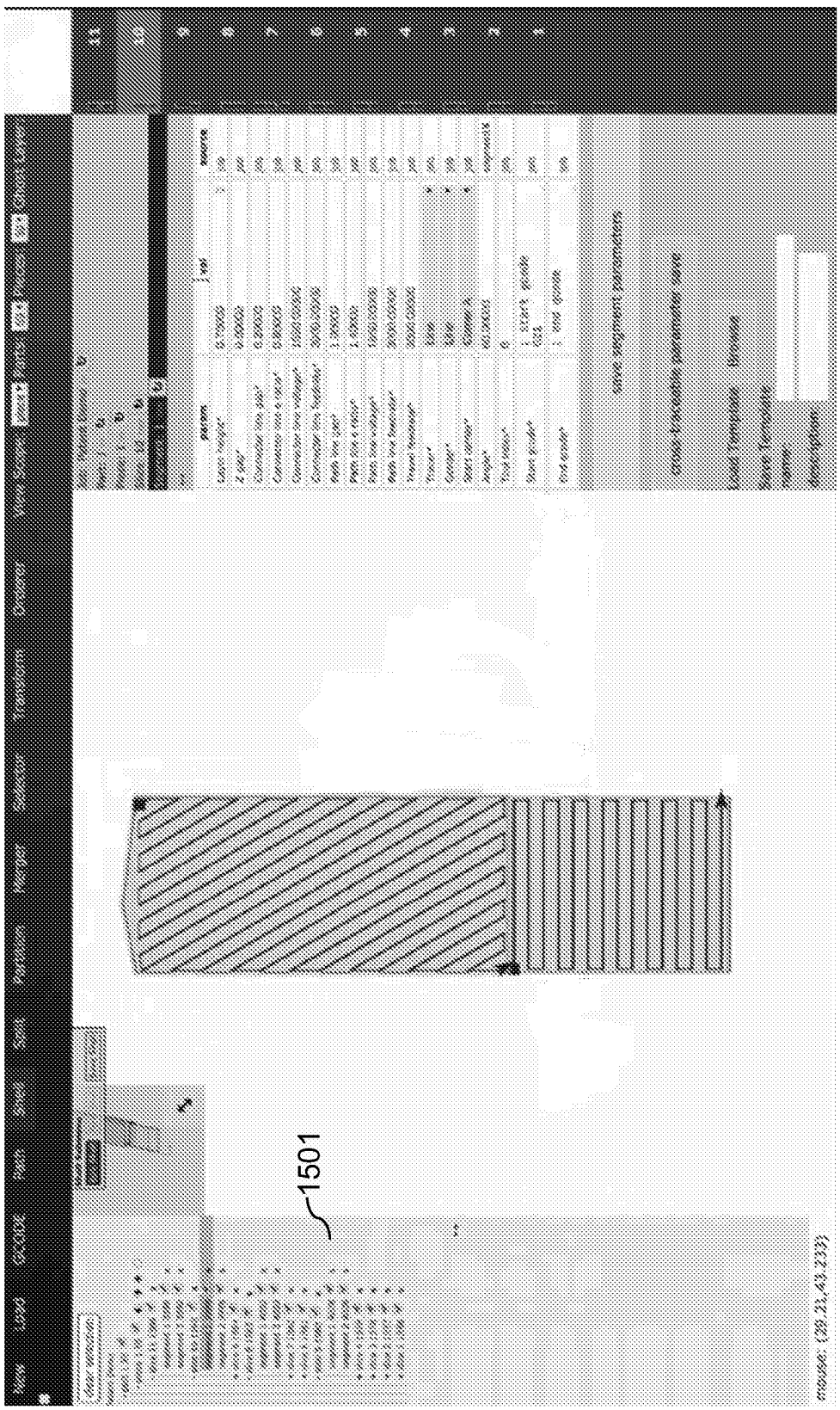
FIG. 15 shows an example of a GUI for selecting a particular segment, a slice, a piece, a layer or a part from a given print job.
Figure 16:
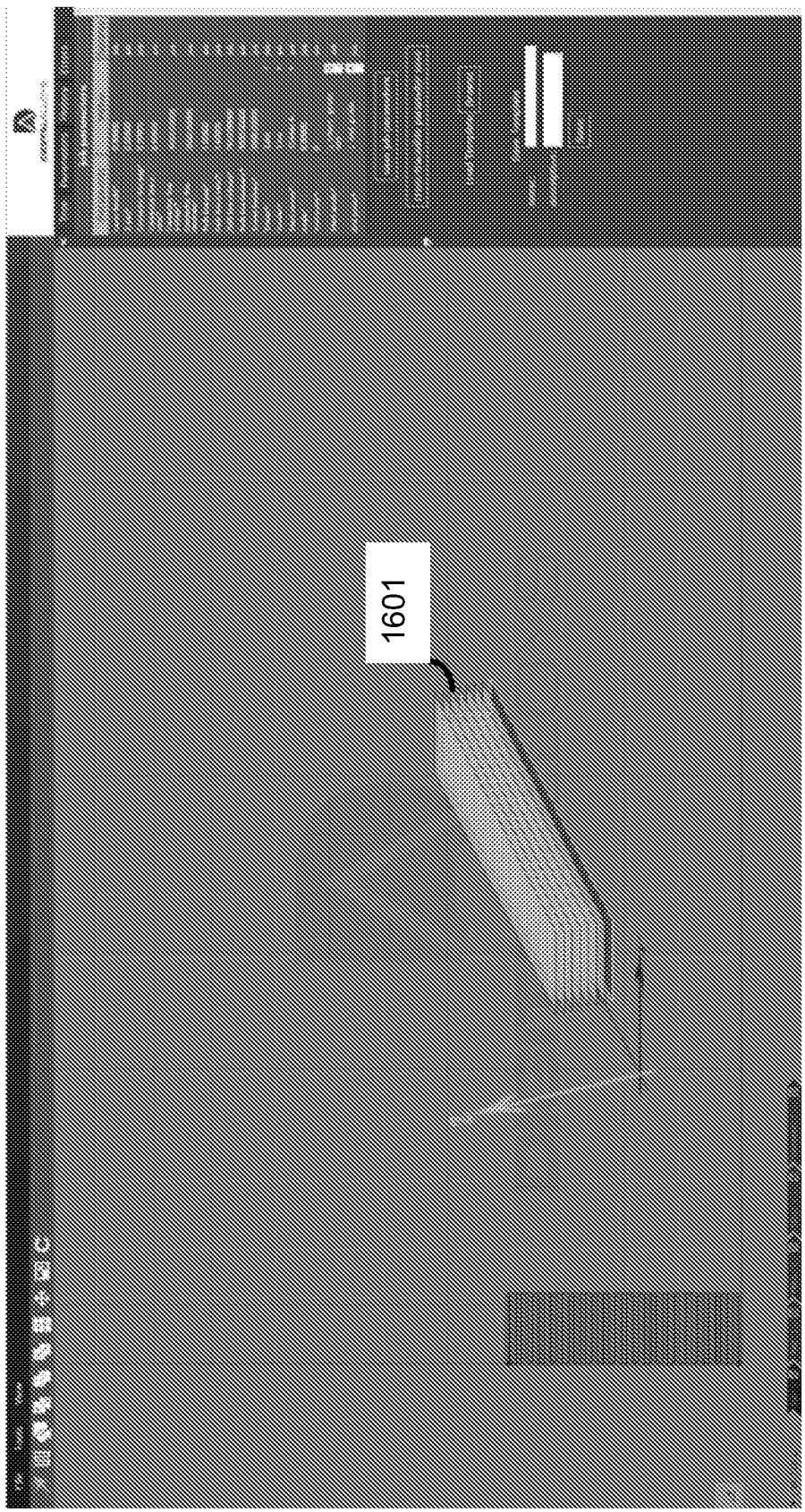
FIG. 16 shows another example of a GUI for selecting a particular segment, a slice, a piece, a layer or a part from a given print job.

FIG. 15 and FIG. 16 show various examples of GUIs for selecting a particular segment, a slice, a piece, a layer or a part from a given print job. As shown in FIG. 15, a tree structure 1501 may be provided for a user to view and select any slice, segment, piece or part. In some cases, upon a selection via the tree structure, the corresponding visual representation may be automatically displayed on the user interface. FIG. 16 shows an additional option for a user to select a portion of the print job. In the illustrated example, a user may select a slice, a segment, a layer, a piece or a part by a direct selection from a partitioned 3D model 1601 of the print job or 3D object.

Figure 17:
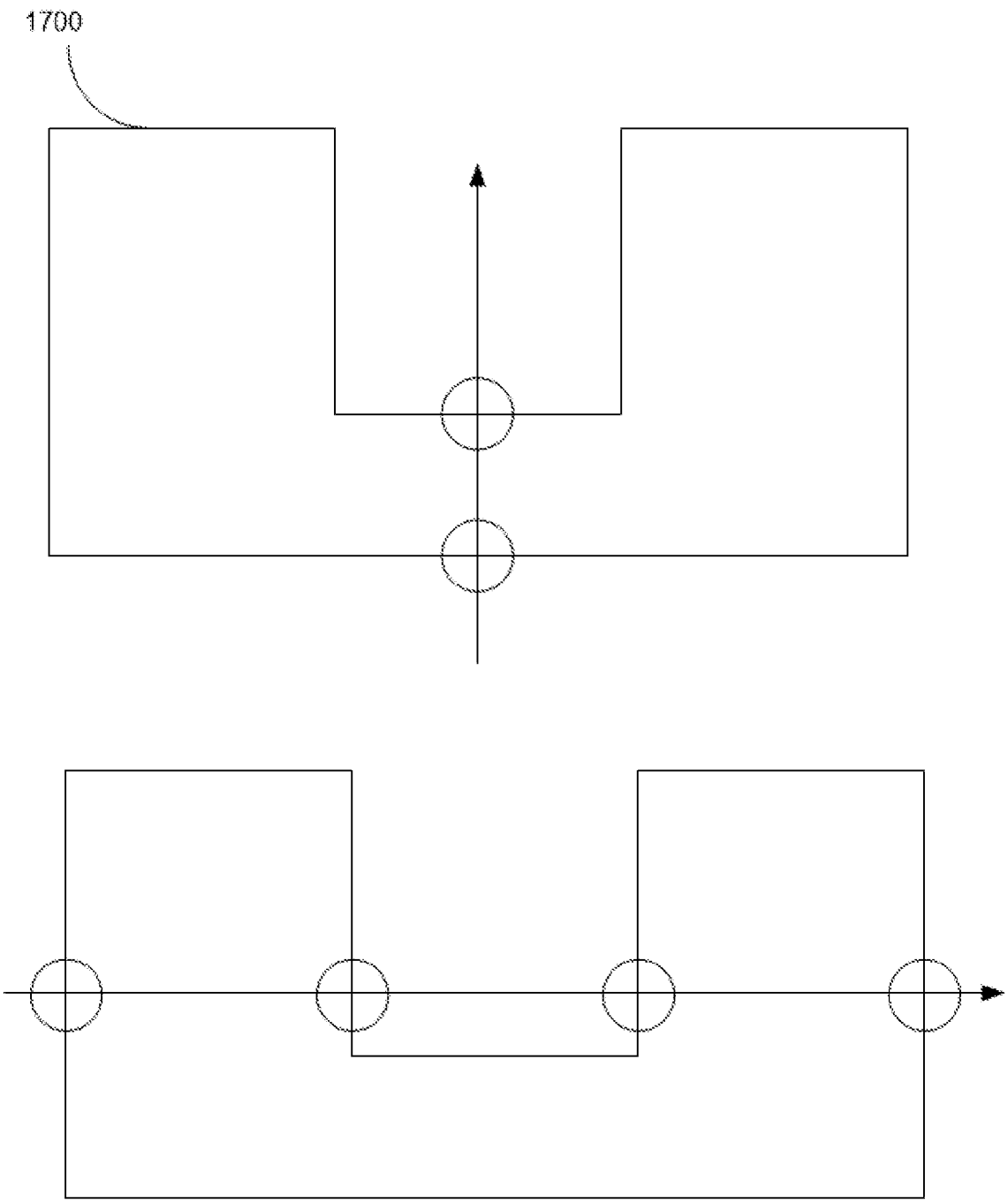
FIG. 17 shows an illustration of a directionally convex polygon.

FIG. 17 shows an example of a directionally convex polygon 1700. The direction of convexity is shown with arrows in the figure. The polygon is directionally convex in a vertical direction but not directionally convex in a horizontal direction. The arrow pointing vertically along the y-axis (top figure) intersects with polygon 1700 twice (two circles). But the arrow pointing horizontally, along the x-axis (bottom figure), intersects with polygon 1700 four times (four circles). Thus, polygon 1700 is directionally convex along the y-axis and not directionally convex along the z-axis.

Figure 18:
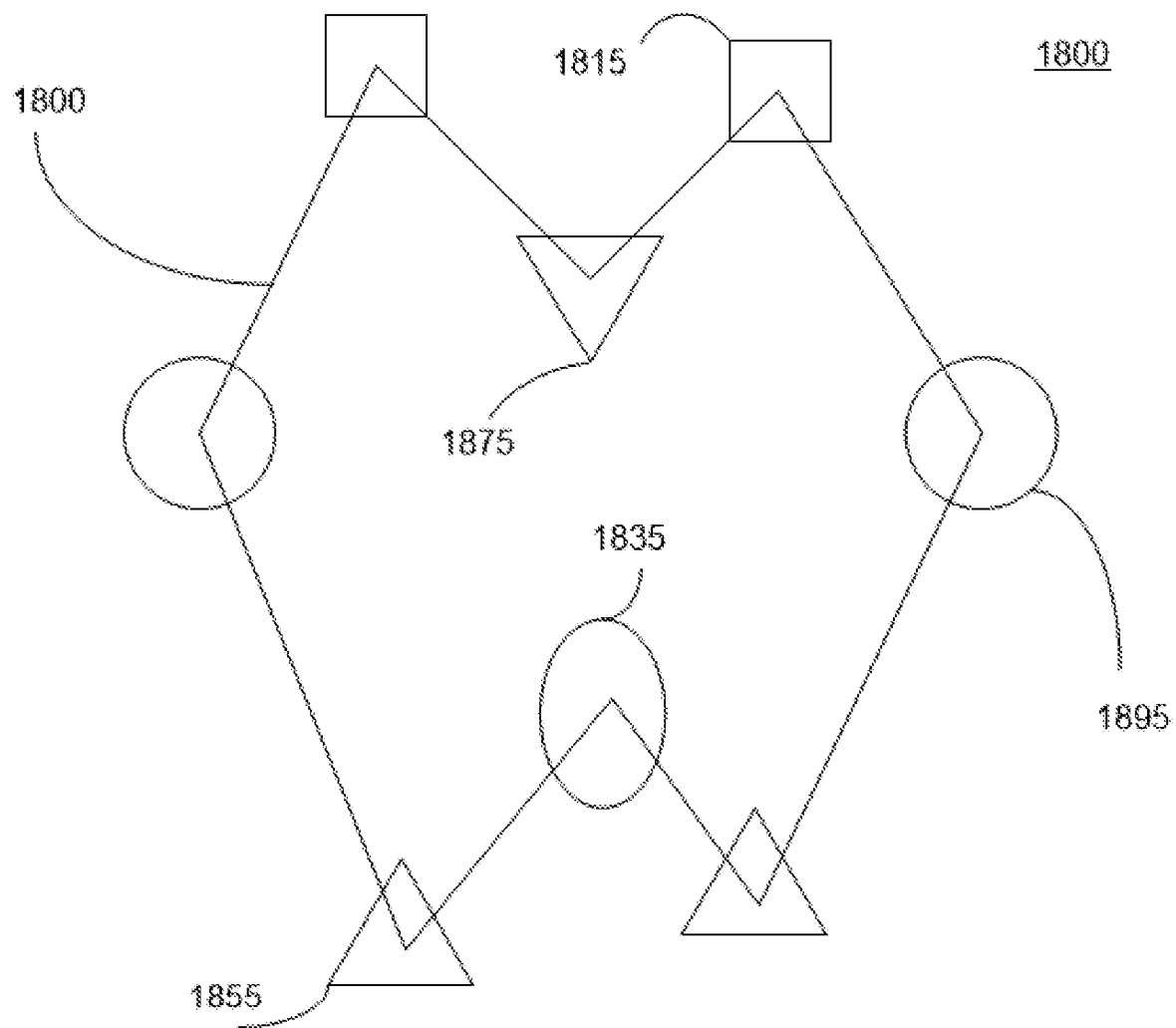
FIG. 18 shows an illustration of a polygon with multiple types of vertices that may be used to directionally partition the polygon using a splitting method.

FIG. 18 shows an example of a polygon 1800 with multiple types of vertices that may be used to directionally partition the polygon using a splitting method. A vertex is a start vertex if its two neighbors lie below it and the interior angle at the vertex is less than $\pi$; start vertices include 1815. If its two neighbors lie below it but the interior angle is greater than $\pi$, then a vertex is a split vertex (if both neighbors lie below the vertex, then the interior angle cannot be exactly $\pi$.), such as vertex 1835. A vertex is an end vertex if its two neighbors lie above it and the interior angle at the vertex is less than $\pi$; 1855 is an end vertex. If a vertex's two neighbors lie above it and the interior angle is greater than $\pi$ then the vertex is a merge vertex; merge vertices include 1875. Regular vertices, such as 1895, may have none of these attributes.

Figure 19:
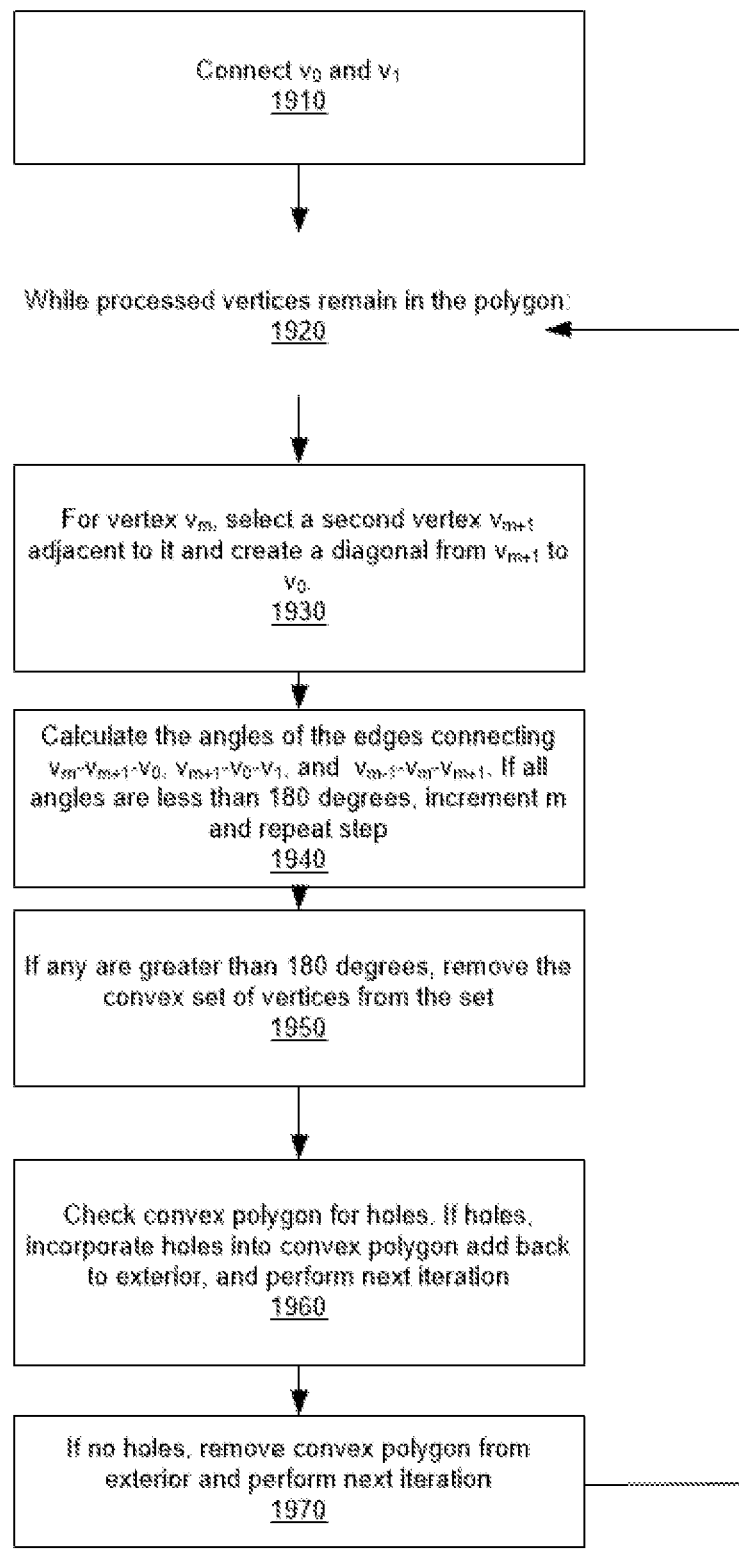
FIG. 19 shows an illustration of process for partitioning a polygon into convex sub-polygons.

FIG. 19 shows an example of a process 1900 for partitioning a polygon into convex sub-polygons. The process may be performed by a computing device using a computer program to store processor-executable instructions for implementing the process. The instructions are used to control the mechanical movements of a printer. The program may number vertices of the polygon $v_0$ to $v_n$. The program may store vertices and edges of the polygon in vertex and edge sets, and may store vertices and edges of the convex sub-polygon in different vertex and edge sets. A first segment may be made 1910 connecting $v_0$ and $v_1$. Next, the process may iterate 1920 while there are unprocessed vertices remaining in the polygon. In this loop, the process may select 1930 vertex $v_m$, a second vertex $v_{m+1}$ adjacent to it and creates a diagonal from $v_{m+1}$ to $v_0$. Next, the process may calculate 1940 the angles of edges connecting $v_m$-$v_{m+1}$-$v_0$, $v_{m+1}$-$v_0$-$v_1$, and $v_{m-1}$-$v_m$-$v_{m+1}$. If all angles are less than 180 degrees, the process may return to step 1920, incrementing the value of m. If any of the angles are greater than 180 degrees, a convex sub-polygon containing 1950 the vertices may be removed from the polygon. This polygon may be checked 1960 for holes, which may be processed and incorporated into the polygon. When holes are processed, the convex sub-polygon may be reincorporated and the process may iterate again with the new polygon containing the vertices of the holes. If there are no holes, the process simply may iterate 1970 after the polygon is removed.

The process may be modified to create larger convex sub-polygons. For example, if any of the three analyzed vertices from step 1930 are larger than 180 degrees, another loop may return to $v_0$ and proceed with iterating through the vertices in the opposite direction. For example, if the process initially proceeded clockwise before stopping, it would proceed counterclockwise on the second pass. In addition, the process may be made more efficient by starting at a notch vertex of the polygon.

Figure 20:
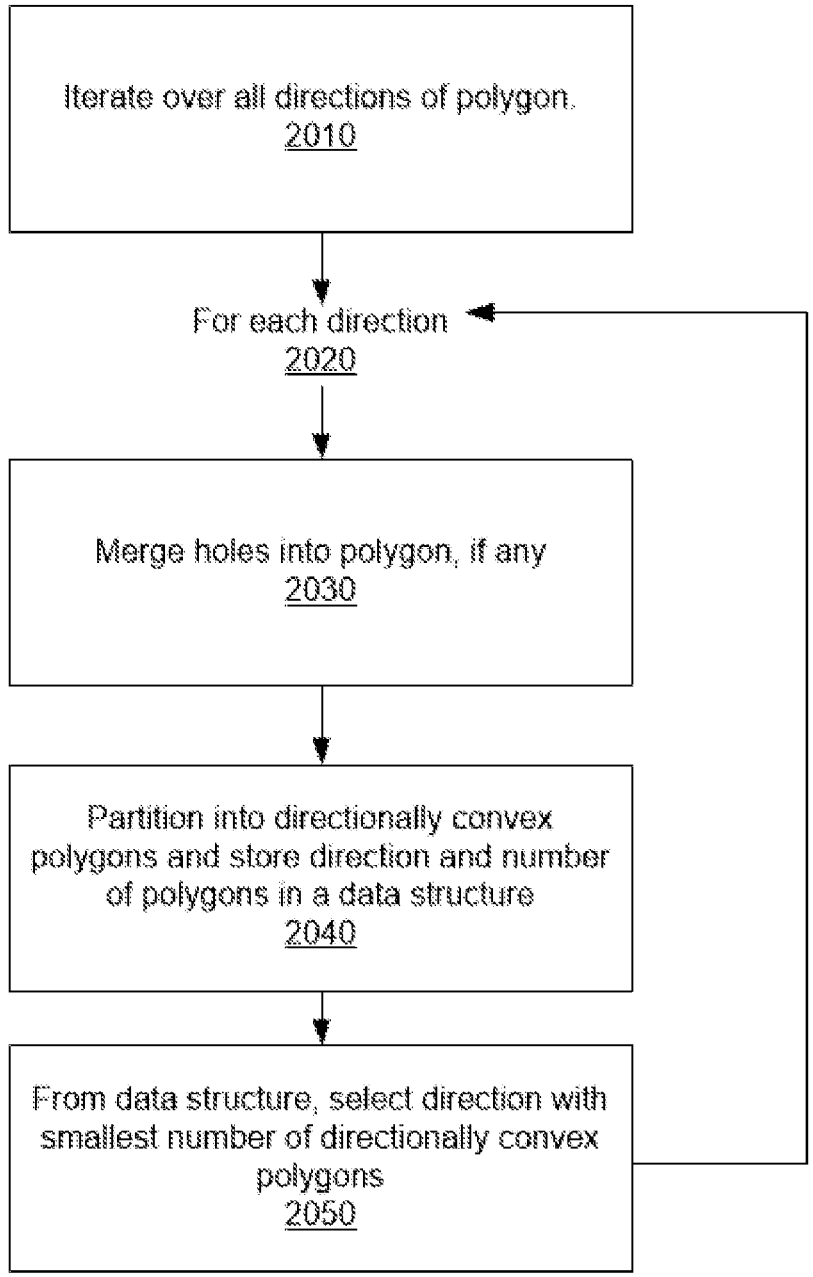
FIG. 20 shows a process for partitioning a polygon into directionally convex sub-polygons.

FIG. 20 shows a process 2000 for partitioning a polygon into directionally convex sub-polygons. The process iterates 2010 through many orientations of a polygon, rotating the polygon, for example, through 360 degrees in steps of two degrees per iteration. For each direction 2020 of orientation of the polygon, holes may be first merged 2030 into the polygon. The polygon may then be partitioned 2040 into directionally convex sub-polygons using a splitting procedure. For each direction, the process may save 2040 a directionally convex sub-polygon decomposition into a data structure. For example, the decompositions may be saved in a hash or a map with the direction as the key and its decomposition as the value. The data structure may then be sorted 2050 in order to choose a most efficient decomposition of directionally convex sub-polygons. For example, the most efficient decomposition of directionally convex sub-polygons may be a decomposition with the smallest number of directionally convex sub-polygons.

Figure 21:
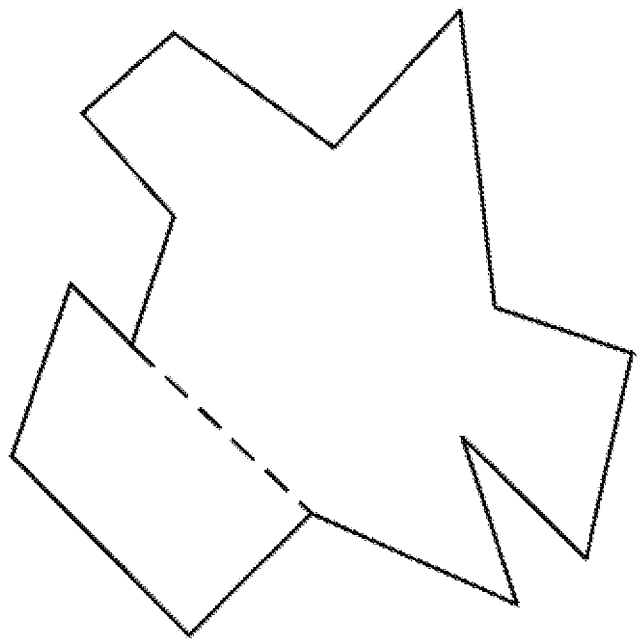
FIG. 21 shows an illustration of a splitting method for directionally partitioning a polygon.
Figure 21:
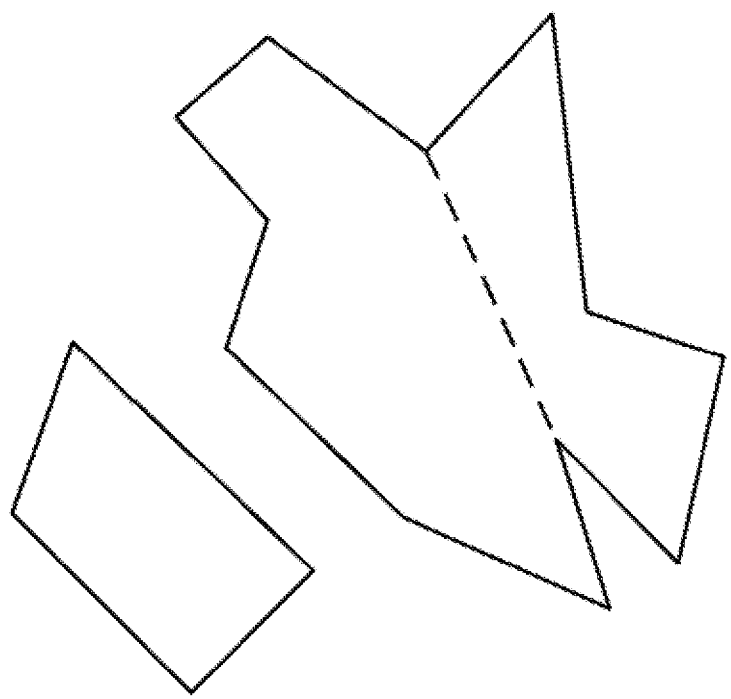

FIG. 21 shows an illustration 2100 of a splitting method for directionally partitioning a polygon. In FIG. 21, the polygon is partitioned along a line connecting a split vertex and a merge vertex, with the partition resulting in a convex sub-polygon. In FIG. 21, the split polygon is again partitioned along another line connecting a split vertex and a merge vertex, creating an additional directionally convex sub-polygon. Multiple sequences of split-merge partitions may exist. For example, a process may iterate through the split and merge vertices within a polygon to generate many sequences of splits. In addition, the splits made vary as the polygon is rotated. As the polygon is rotated, the vertices that are split vertices and merge vertices may change, affecting lines by which the polygon is split. A rotation angle may be chosen to result in the smallest number of convex polygons generated using the splitting method of FIG. 21.

Figure 22:
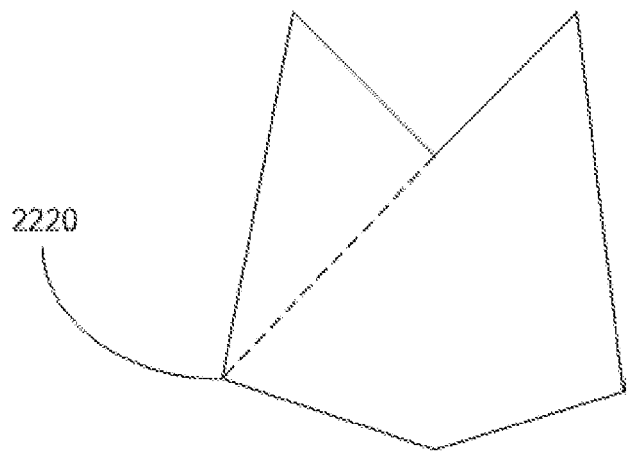
FIG. 22 shows an illustration of the splitting method when there are not split-merge vertex pairs.
Figure 22:
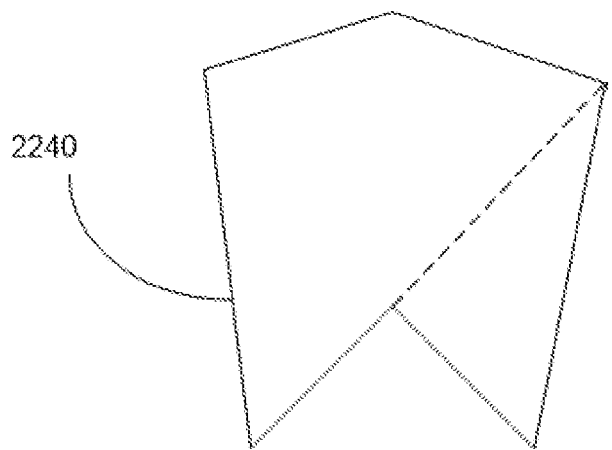

FIG. 22 shows an illustration 2200 of the splitting method when there are not split-merge vertex pairs. Polygon 2220 has a merge vertex and polygon 2240 has a split vertex. In these cases, the splitting method simply chooses the closest vertex under the merge vertex in polygon 2200 and the closest vertex above the split vertex in polygon 2240.

Figure 23:
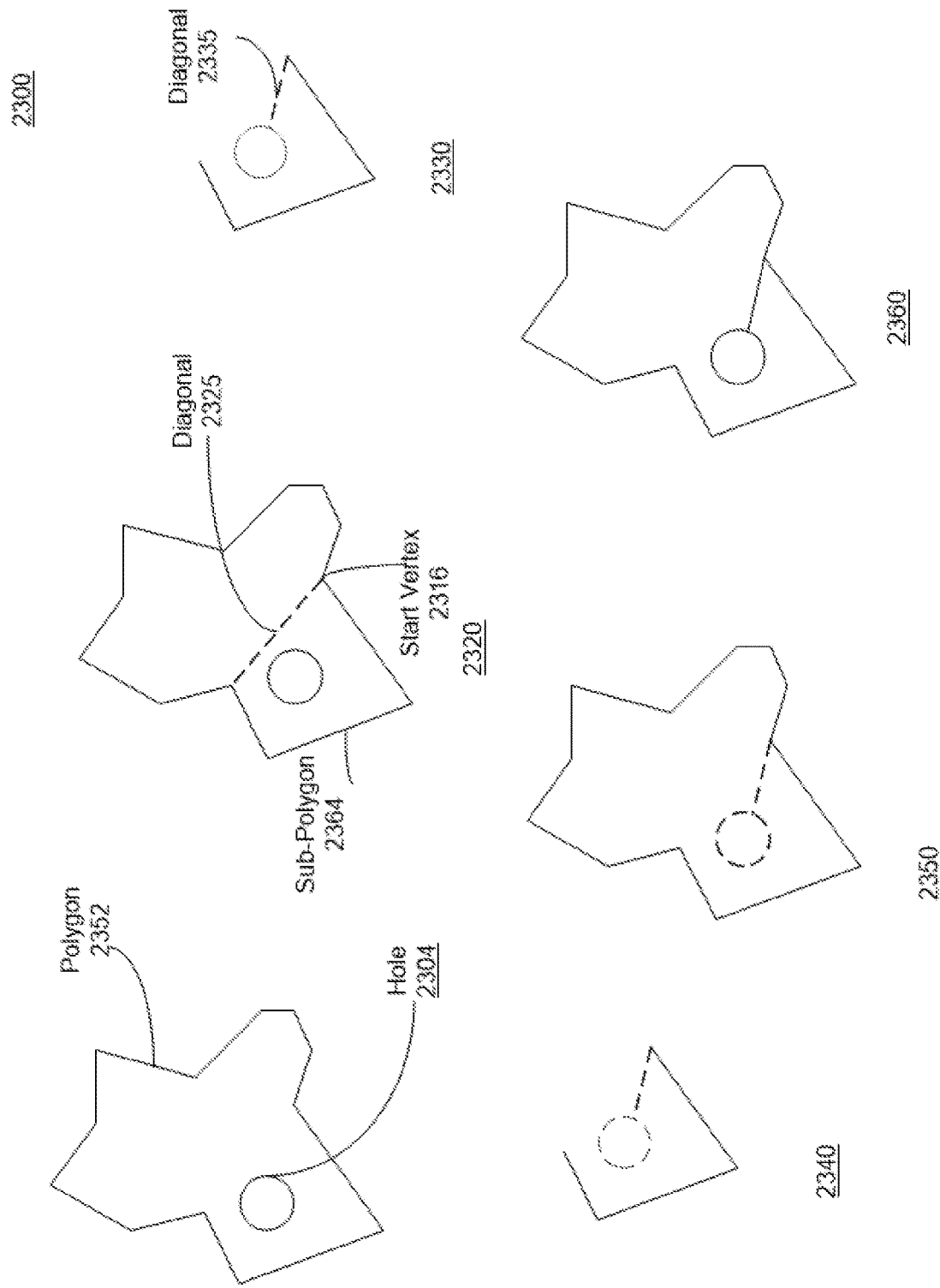
FIG. 23 shows a process for incorporating a set of vertices comprising a hole into a polygon, allowing polygons containing holes to be processed and partitioned into convex sub-polygons.

FIG. 23 shows a process 2300 for incorporating a set of vertices comprising a hole 2304 into a polygon 2352, allowing polygons containing holes to be processed and partitioned into convex sub-polygons. From a start vertex 2316, a convex sub-polygon 2364 bounded by diagonal 2325 is found 2320 and detached, using the process of FIG. 19. The convex sub-polygon 2364 contains the hole 2304. The convex sub-polygon 2364 created is removed 2330 from the rest of the polygon 2352. A diagonal 2335 is drawn 2340 to the hole from the start vertex used to initiate the polygon partitioning process (now part of the convex sub-polygon). But the diagonal may originate at another vertex or along an edge of the convex-sub polygon. If there are multiple holes within the convex sub-polygon 2364, the hole closest to the start vertex of the diagonal may be chosen. This may help prevent future incorporated holes from creating intersections with the first incorporated hole. The convex sub-polygon 2364 is re-merged 2350 with the original polygon, and the new vertices created from the hole and the diagonal are added 2360 to the original polygon.

Figure 24:
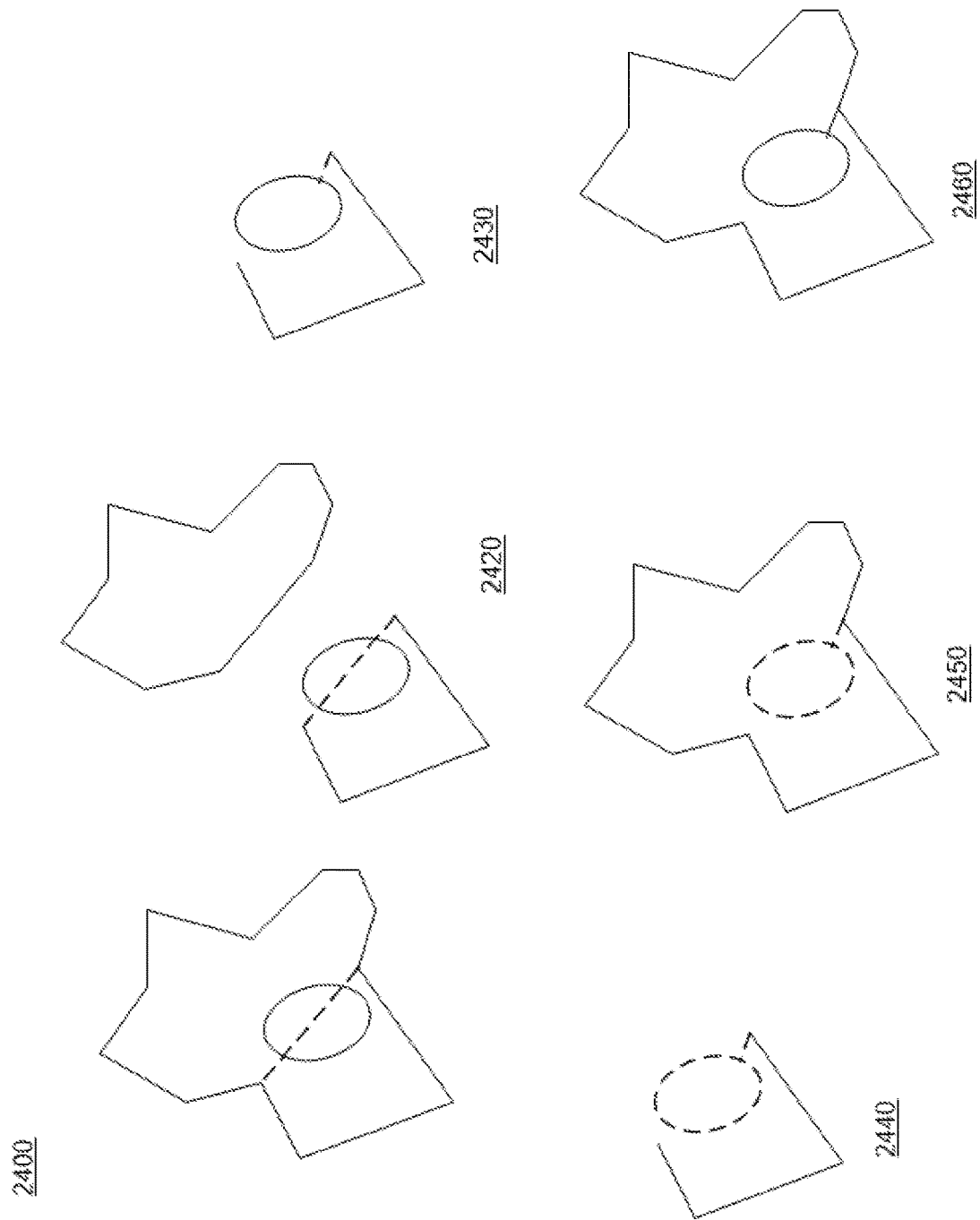
FIG. 24 shows an illustration of a process for incorporating a set of vertices comprising a hole into a polygon when the diagonal line partitioning the convex sub-polygon intersects a hole.

FIG. 24 shows an illustration of a process 2400 for incorporating a set of vertices comprising a hole into a polygon when the diagonal line partitioning the convex sub-polygon intersects a hole. The first two steps 2420 and 2430 are identical to those for when the partitioned convex sub-polygon contains the hole. In the third step 2440, the shortest line from the starting vertex to any point on the exterior of the hole is found. The line and hole are incorporated 2450 into the convex sub-polygon, which is reincorporated 2460 into the original polygon.

Figure 25:
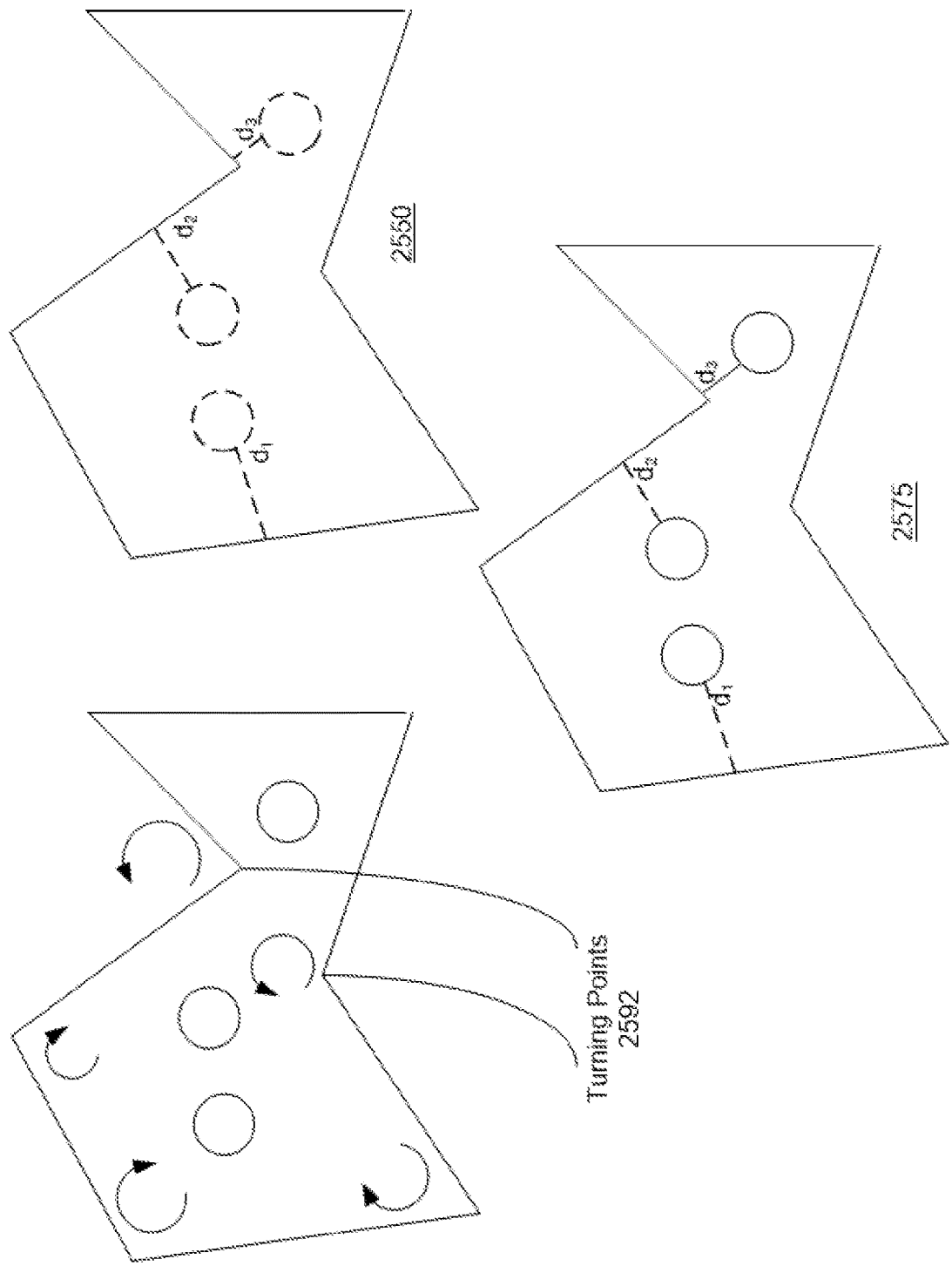
FIG. 25 shows a process for incorporating a set of vertices comprising a hole into a polygon.

FIG. 25 shows a process 2500 for incorporating a set of vertices comprising a hole into a polygon. The process may calculate 2550 distances between the vertices of the polygon and the holes within the polygon. The hole that is closest to the polygon exterior may be chosen, and a diagonal may be created 2575 from the exterior vertex to the closest vertex on the hole. The vertices of the hole and/or the diagonal may then be incorporated into the polygon. This may be done iteratively, for all of the holes within the polygon.

In order to increase the efficiency of the directional partitioning algorithm, the holes may be incorporated into the polygon in a manner that minimizes a number of turning points along the exterior of the polygon. For an orientation of the polygon or shape, the turning points may be points that indicate changes in direction along the contour of the polygon. For example, a turning point may change the direction of the contour from clockwise to counterclockwise, or from counterclockwise. Turning points 2592 are shown in FIG. 25. The diagonals may then be drawn between the holes and their closest turning points, minimizing the number of directionally convex sub-polygons in the final partition.

Figure 26:
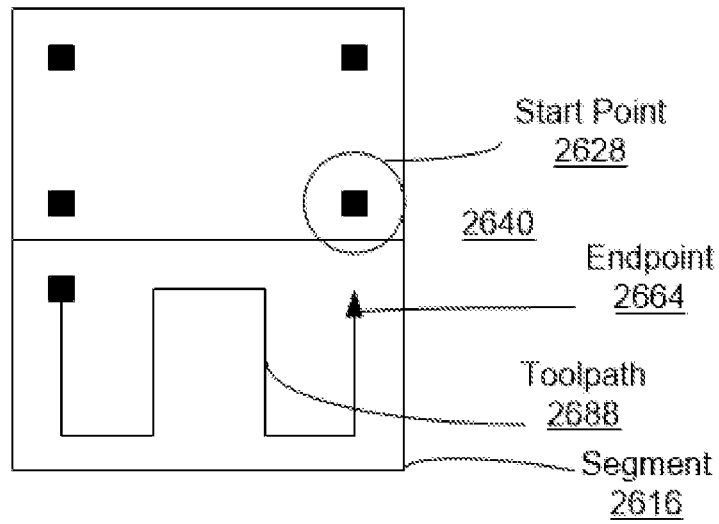
FIG. 26 shows two steps of an algorithm for printing segments in an efficient order.
Figure 26:
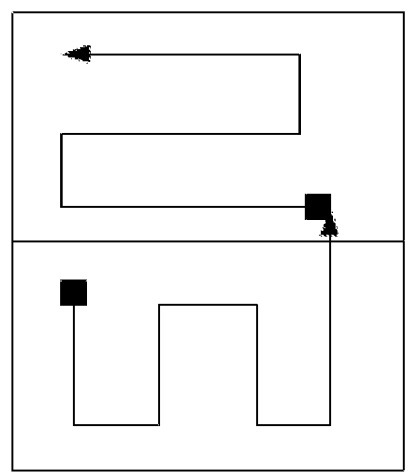

FIG. 26 shows two steps 2640 and 2680 of an algorithm 2600 for printing segments in an efficient order. The algorithm may be implemented as a greedy algorithm. For a multilayer print job, a printing loop may iterate while one or more layers contain unprinted segments. If no segments within any of the layers have been printed, the printing may start at an arbitrary start point within a first segment on the bottom layer. This start point may be a global origin point, designated numerically by (0,0), for example. When printing within a layer, each segment is designated by a start point and an endpoint. To print a first segment on a next layer up, the start point for printing the first segment may be the endpoint of the final printed segment of the current layer. For printing a next unprinted segment within a layer, another loop may iterate through printing the unprinted segments. First, a start point may be determined for each unprinted segment within the layer. Then, a start point closest to an endpoint of a most recently printed segment may be selected. Finally, the next segment may be printed, starting from the selected startpoint and finishing at the segment endpoint. This process may continue for all unprinted segments within the layer, and then subsequently for each additional layer's segments.

In FIG. 26, within a first step, the segment 2616 within a single layer is printed by a tool following a toolpath 2688. There are four possible starting locations 2628 for printing the next segment. The algorithm selects the start point 2628 closest to the toolpath's end location. Then, the next segment may be printed along the toolpath 2688, such as by a printer with a print head. The algorithm of FIG. 26 may be used to print segments within a layer as well as with multiple layers and is designed to decrease the overall amount of movement of a print head.

Additional heuristics may be incorporated into the algorithm 2600. The algorithm may be modified to minimize heat dissipated throughout the printing process, to minimize a number of printing instructions implemented by the printer, to minimize a number of material change operations, to minimize a number of tool change operations, or to minimize an amount of printing filament used, for example. In addition to minimizing one of these factors, users may set proportional 'weights' for multiple factors and the algorithm may minimize an overall score that may be calculated from some or all of the weights. The score may be, for example, a weighted sum or average.

Figure 27:
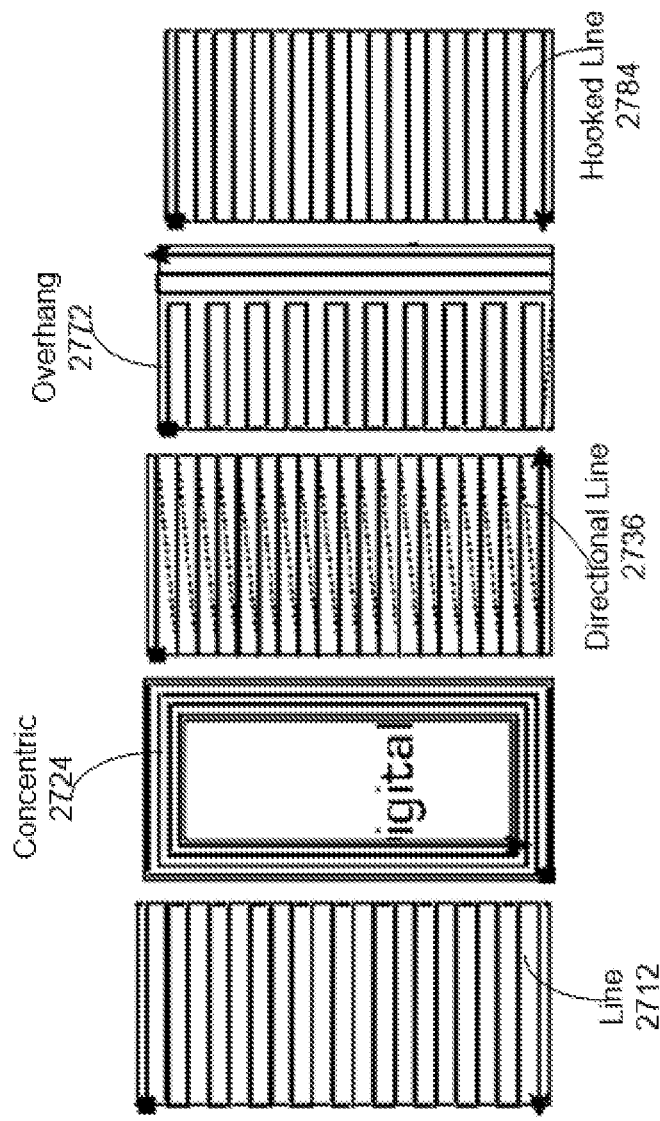
FIG. 27 shows an illustration of multiple fill patterns supported by the printer.

FIG. 27 shows an illustration of multiple fill patterns supported by the printer. Fill patterns describe the motion of the traversal of a printing tool, such as a print head, as it prints a segment within a layer. FIG. 27 shows line 2712, concentric 2724, directional line 2736, overhang 2772, and hooked line 2784 fill patterns.

While preferred embodiments of the present invention have been shown and described herein, it will be obvious to those skilled in the art that such embodiments are provided by way of example only. It is not intended that the invention be limited by the specific examples provided within the specification. While the invention has been described with reference to the aforementioned specification, the descriptions and illustrations of the embodiments herein are not meant to be construed in a limiting sense. Numerous variations, changes, and substitutions will now occur to those skilled in the art without departing from the invention. Furthermore, it shall be understood that all aspects of the invention are not limited to the specific depictions, configurations or relative proportions set forth herein which depend upon a variety of conditions and variables. It should be understood that various alternatives to the embodiments of the present disclosure described herein may be employed in practicing the invention. It is therefore contemplated that the invention shall also cover any such alternatives, modifications, variations or equivalents. It is intended that the following claims define the scope of the invention and that methods and structures within the scope of these claims and their equivalents be covered thereby.

What is claimed is:

1. A method for printing a three-dimensional object, comprising:
   a. receiving in computer memory a digital model of said three-dimensional object;
   b. using one or more computer processors to partition said digital model of said three-dimensional object into a plurality of partitions, wherein a partition of said plurality of partitions comprises a plurality of slices, and wherein a slice of said plurality of slices comprises a plurality of segments;
   c. receiving, from a user, one or more parameters that specify a printing configuration for at least one segment of said plurality of segments;
   d. determining an order in which to print said plurality of segments, wherein said determining said order comprises: while one or more layers contain unprinted segments:
      (a) if no segments are printed within any layers, for a first segment within a first layer, selecting a start point;
      (b) else if no segments are printed on a layer that is not the first layer, setting a start point that is an endpoint of a terminal segment of a previous layer;
      (c) else if at least one segment is printed within a layer, each printed segment comprising a start point and an endpoint:
         while there are unprinted segments:
            a) determining a start point for each unprinted segment within the layer;
            b) selecting a closest start point to an endpoint of a most recently printed segment; and
            c) tracing a next segment, starting at said closest start point and stopping at an endpoint following a toolpath;
      and
   e. generating printing instructions based at least in part on said one or more parameters, which printing instructions are usable by a printer to print said three-dimensional object.

2. The method of claim 1, wherein the toolpath has a fill pattern selected from the group consisting of: a line, a concentric pattern, a directional line, an overhang pattern, and a hooked line.

3. The method of claim 1, wherein determining said order includes determining a sequence that reduces (i) heat generated by said printer, (ii) a number of lifting operations performed by said printer, (iii) one or more tool change operations performed by said printer, or (iv) one or more material change operations performed by said printer while printing said three-dimensional object.

4. The method of claim 1, wherein said three-dimensional object is printed by (i) bringing a feedstock in contact with a platform or a previously deposited layer of said three-dimensional object, and (ii) directing electrical current to flow from said feedstock and into said platform or said previously deposited layer of said three-dimensional object, or vice versa, to melt at least a portion of said feedstock and deposit said at least said portion of said feedstock adjacent to said platform or said previously deposited layer of said three-dimensional object, thereby forming at least a portion of said three-dimensional object.

5. The method of claim 1, further comprising using said printing instructions to print said three-dimensional object.

* * * * *